(12) United States Patent
Perrott

(10) Patent No.: US 9,673,768 B2
(45) Date of Patent: Jun. 6, 2017

(54) MULTIPATH DIGITAL MICROPHONES

(71) Applicant: INVENSENSE, INC., San Jose, CA (US)

(72) Inventor: Michael H. Perrott, Nashua, NH (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/812,576

(22) Filed: Jul. 29, 2015

(65) Prior Publication Data
US 2017/0033754 A1    Feb. 2, 2017

(51) Int. Cl.
| | | |
|---|---|---|
| H04R 3/00 | (2006.01) | |
| H03G 3/30 | (2006.01) | |
| H04R 29/00 | (2006.01) | |
| H04H 60/04 | (2008.01) | |

(52) U.S. Cl.
CPC ......... *H03G 3/3026* (2013.01); *H03G 3/3036* (2013.01); *H03G 3/3089* (2013.01); *H04H 60/04* (2013.01); *H04R 29/006* (2013.01); *H04R 2201/003* (2013.01); *H04R 2430/01* (2013.01)

(58) Field of Classification Search
CPC ............ H04R 29/006; H04R 2201/003; H04R 2430/01; H03G 3/3026; H03G 3/3036; H03G 3/3089
USPC .............................. 381/91–92, 122, 104, 107
See application file for complete search history.

(56) References Cited

U.S. PATENT DOCUMENTS

| | | | | |
|---|---|---|---|---|
| 2009/0161883 | A1* | 6/2009 | Katsianos | H03G 9/005 381/57 |
| 2011/0026739 | A1 | 2/2011 | Thomsen et al. | |
| 2011/0029109 | A1 | 2/2011 | Thomsen et al. | |
| 2012/0033817 | A1* | 2/2012 | Francois | G10L 19/008 381/2 |
| 2013/0195291 | A1 | 8/2013 | Josefsson | |
| 2014/0010374 | A1* | 1/2014 | Kasai | H04R 3/00 381/26 |
| 2014/0086433 | A1 | 3/2014 | Josefsson | |
| 2014/0133677 | A1* | 5/2014 | Zerbini | H04R 19/005 381/119 |
| 2014/0140538 | A1* | 5/2014 | Kropfitsch | H03G 3/002 381/106 |
| 2015/0124981 | A1* | 5/2015 | Veneri | H04R 3/005 381/58 |
| 2015/0237432 | A1* | 8/2015 | Miluzzi | H04R 1/08 381/111 |

* cited by examiner

*Primary Examiner* — Disler Paul
(74) *Attorney, Agent, or Firm* — Amin, Turocy & Watson, LLP

(57) ABSTRACT

Multipath digital microphone systems comprising a multipath digital audio combiner component are described. Exemplary multipath digital microphone systems can switch from conveying one digital audio signal to conveying another digital audio signal based on one or more switching criteria determined by an exemplary multipath digital audio combiner component. Provided implementations can be configured to switch from conveying one digital audio signal to conveying digital audio signal according to an algorithm to provide low-power, high dynamic range digital microphone systems, without audible artifacts associated with conventional digital microphone systems.

25 Claims, 16 Drawing Sheets

MULTIPATH DIGITAL MICROPHONES

TECHNICAL FIELD

The subject disclosure relates to digital microphones and, more specifically, to multipath digital microphone implementations.

BACKGROUND

Microphones can be exposed to environments where sound levels, described on a log scale using units of decibels of sound pressure level (dB SPL), can range from very quiet (e.g., less than 25 dB SPL) to very loud (e.g., 140 dB SPL). In addition, microphones are typically required to maintain their performance over a large signal range, e.g., up to 120 dB. Simultaneously, microphones are required to exhibit very small intrinsic noise in order to make weak audio signals detectable, while they also need to handle very large audio signals without significant distortion. As a result, such requirements dictate that microphones have a very large dynamic range (DR).

Analog and digital microphones output a voltage or digital output stream, respectively, corresponding to the audio signal sensed by the microphone. The advantage of a digital microphone is that its digital output stream is relatively immune to noise and that an analog-to-digital converter (ADC) is not required to perform digital signal processing on the microphone digital output stream. However, one disadvantage of a digital microphone is that its dynamic range is often lower than what can be achieved with an analog microphone due to constraints in the power consumption that can be allocated to the microphone within many applications.

Conventional solutions for improving DR of a digital microphone can include techniques such as employing one or more of a high DR ADC or employing an automatic gain control amplifier (AGC) which can significantly lower ADC DR requirements while still meeting the desired max SPL and noise floor levels of the overall digital microphone. However, such conventional solutions can require excessively large power consumption and/or introduce troublesome artifacts. Other solutions can require specific analog front ends that are likely to suffer from low signal to noise ratio (SNR) performance or multipath approaches that, due to the combining algorithm can suffer from instantaneous saturation effects. In addition, the ability to integrate a high DR digital microphone is desirable for implementation in devices such as mobile devices that can be exposed to a variety of widely varying SPL environments. For example, a digital microphone comprising one or more microelectromechanical systems (MEMS) acoustic sensors with a component implementing an algorithm for high DR in complementary metal oxide semiconductor (CMOS) processes can provide a low power, high DR digital microphone suitable for such mobile devices.

It is thus desired to provide high dynamic range digital microphones that improve upon these and other deficiencies. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, an exemplary multipath digital audio combiner component is described that can comprise a plurality of digital audio filters operatively coupled to a plurality of analog-to-digital converters (ADCs) and configured to receive a plurality of digital audio signals having different scaling factors of an associated audio signal and configured to provide a plurality of filtered digital audio signals. The exemplary multipath digital audio combiner component can further comprise a gain and offset estimation component configured to estimate at least one of gain differences or offset differences between the plurality of filtered digital audio signals. In addition, the exemplary multipath digital audio combiner component can comprise a multiplexing component configured to switch from conveying one of a plurality of corrected digital audio signals to conveying a second one of the plurality of corrected digital audio signals.

In addition, exemplary multipath digital microphone systems can comprise a multipath digital audio combiner component operatively coupled to a plurality of outputs associated with a plurality of ADCs and configured to perform gain and offset correction for the plurality of digital audio signals to provide a plurality of corrected digital audio signals according to a plurality of scaling factors. Furthermore, exemplary multipath digital microphone systems can comprise a multiplexing component associated with the multipath digital audio combiner component configured to switch from conveying one of a plurality of corrected digital audio signals to conveying a second one of the plurality of corrected digital audio signals, based on at least one switching criteria determined by the multipath digital audio combiner component. In another non-limiting aspect, exemplary systems can also comprise an output component configured to transmit a digital signal associated with the digital MEMS microphone comprising one or more of a pulse-density modulation (PDM) signal, integrated interchip sound ($I^2S$) signal, or a Soundwire signal.

In a further non-limiting aspect, exemplary methods associated with multipath digital microphone systems are described.

These and other embodiments are described in more detail below.

BRIEF DESCRIPTION OF THE DRAWINGS

Various non-limiting embodiments are further described with reference to the accompanying drawings, in which.

DETAILED DESCRIPTION

Overview

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

According to various described embodiments, the subject disclosure provides digital microphones, systems, and methods for multipath digital microphones. In non-limiting aspects, exemplary embodiments can comprise a multipath digital audio combiner component configured to perform gain and offset correction for a plurality of digital audio signals to provide and switch between a plurality of corrected digital audio signals according to a plurality of scaling factors. For instance, as described above, a digital microphone outputs a digital output stream corresponding to an audio signal sensed by the microphone. While a digital microphone is relatively immune to noise and does not require on ADC on its output stream, the dynamic range can be lower than what can be achieved with an analog microphone unless constraints in the microphone power consumption for particular applications can be met.

Figure 1:
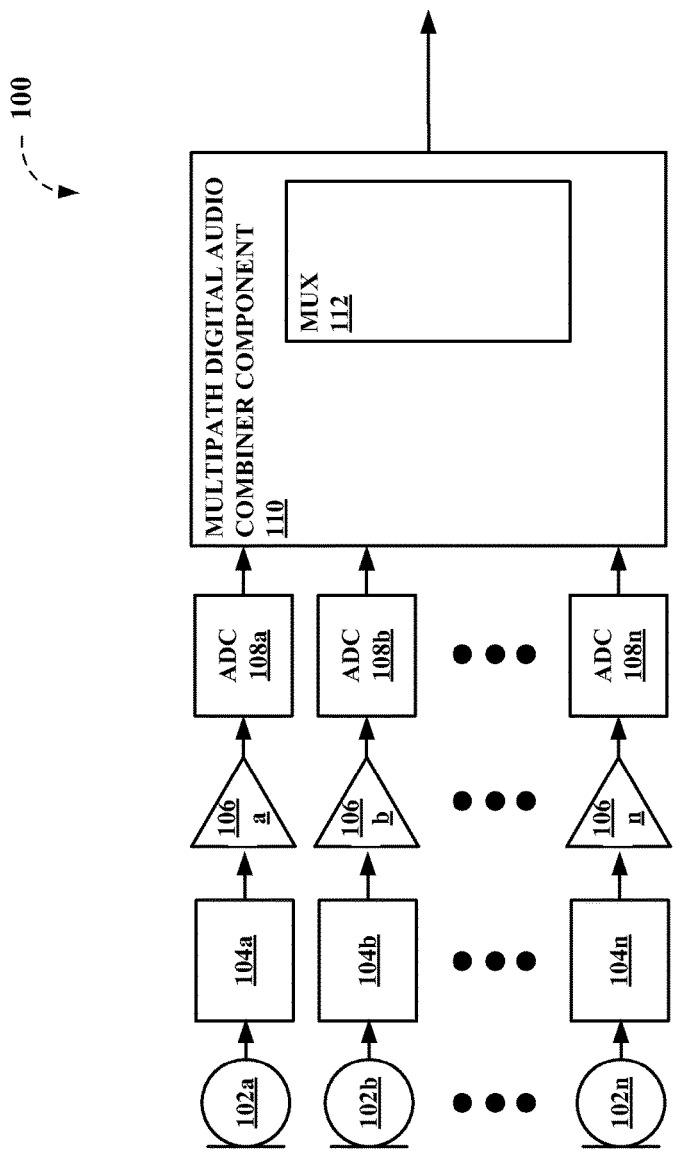
FIG. 1 depicts a functional block diagram of an exemplary system comprising an exemplary multipath digital audio combiner component according to aspects of the subject disclosure.

FIG. 1 depicts a functional block diagram of an exemplary system 100 comprising an exemplary multipath digital audio combiner component according to aspects of the subject disclosure. As a non-limiting example, an exemplary system 100 can comprise one or more exemplary microelectromechanical systems (MEMS) acoustic or microphone sensors 102 (e.g., one or more of MEMS acoustic or microphone sensor 102a, 102b, . . . , 102n, etc.). In various embodiments, exemplary systems are depicted as comprising one MEMS acoustic or microphone sensor 102, whereas other exemplary systems are depicted as comprising more than one MEMS acoustic or microphone sensors 102. It can be appreciated that the various MEMS acoustic or microphone sensors 102 need not be identical in design, fabrication, characteristic, and/or placement, etc., and according to a non-limiting aspect, the one or more exemplary microelectromechanical systems (MEMS) acoustic or microphone sensors 102 vary in one or more of the forgoing aspects. In a non-limiting aspect, the one or more of MEMS acoustic or microphone sensors 102 can be configured to receive one or more of the acoustic signal or a variation associated with the acoustic signal (e.g., such as the acoustic signal varied by differences in time, location, acoustic path, etc.) or can be comprised of any number of disparate transducer structures (e.g., numbers and/or configuration of membranes, etc.), any number of front end circuit designs (e.g., supplying variable charge pump voltages, etc.), for example, as describe above regarding FIG. 11, etc.

The one or more MEMS acoustic or microphone sensors 102 can be configured to receive one or more acoustic signals, and can be operatively coupled to one or more components or circuitry 104 (e.g., one or more of components or circuitry 104a, 104b, . . . , 104n, etc., sometimes referred to, herein, as, "front end") configured to process one or more electrical signals (e.g., one or more electrical signals associated with one or more of MEMS acoustic or microphone sensor 102a, 102b, . . . , 102n, etc.) that vary in accordance with the one or more acoustic signals to create one or more corresponding processed electrical signal (e.g., at one or more outputs of the one or more of components or circuitry 104a, 104b, . . . , 104n, etc.). In a non-limiting aspect, the one or more components or circuitry 104 (e.g., one or more of components or circuitry 104a, 104b, . . . , 104n, etc.) can comprise one or more adjustable direct current (DC) bias voltage circuit operatively coupled to the one or more of MEMS acoustic or microphone sensors 102 and can be configured to adjust one or more DC bias voltage provided to the one or more of MEMS acoustic or microphone sensors 102, respectively.

In a further non-limiting example, an exemplary system 100 can comprise one or more exemplary preamplifiers 106 (e.g., one or more of preamplifiers 106a, 106b, . . . , 106n, etc.) operatively coupled to the one or more output associated with the one or more components or circuitry 104 (e.g., one or more of components or circuitry 104a, 104b, . . . , 104n, etc.). In a non-limiting aspect, the one or more preamplifiers 106 can be configured to receive the one or more corresponding processed electrical signals and/or apply one or more scaling factors (e.g., one or more first scaling factors) to the one or more corresponding processed electrical signals. In addition, exemplary system 100 can further comprise one or more exemplary ADCs 108 (e.g., one or more of ADC 108a, 108b, . . . , 108n, etc.) operatively coupled to one or more outputs associated with the one or more preamplifiers 106. In another non-limiting aspect, the one or more exemplary ADCs 108 can be configured to provide one or more digital audio signals having different scaling factors associated with the one or more acoustic signals (e.g., at outputs associated with the one or more of ADC 108a, 108b, . . . , 108n, etc.). In further non-limiting examples, exemplary system 100 can further comprise circuitry (not shown) integrated within the exemplary system 100 for configuring one or more of the one or more scaling factors (e.g., one or more first scaling factors) associated with one or more of the one or more exemplary preamplifiers 106, as further described herein, for example, regarding FIGS. 5, 11, etc. In yet another non-limiting aspect, ADC parameters for exemplary ADCs 108, such as its reset state, etc. can be determined based on signal strength indicated by amplitude or root-mean-square power measurement from digitized data in one or more of the paths (e.g., low SPL path, high SPL path, etc.), example, as described below regarding FIGS. 5-6, etc.

In a further non-limiting example, an exemplary system 100 can comprise an exemplary multipath digital audio combiner component 110 operatively coupled to one or more outputs associated with the one or more ADCs 108 (e.g., outputs associated with the one or more of ADC 108a, 108b, . . . , 108n, etc.). In a non-limiting aspect, the exemplary multipath digital audio combiner component 110 can be configured to perform gain and offset correction for the one or more digital audio signals to provide one or more of corrected digital audio signals according to one or more scaling factors (e.g., one or more second scaling factors), for example, as further described herein, regarding FIGS. 6-7, 12-14, etc. In a non-limiting aspect, exemplary implementations of system 100 comprising exemplary multipath digital audio combiner component 110 can facilitate providing one or more scaling factors (e.g., one or more second scaling factors) that can be adjustable based on a desired performance parameter associated with the exemplary system 100.

Additionally, various non-limiting implementations of exemplary system 100 can comprise an exemplary multiplexing (MUX) component 112 associated with the multipath digital audio combiner component 110. In a non-limiting aspect, an exemplary MUX component 112 can be configured to switch from conveying one of one or more of corrected digital audio signals to conveying a second one of the one or more of corrected digital audio signals based on one or more switching criteria determined by an exemplary multipath digital audio combiner component 110. As a non-limiting example, an exemplary MUX component 112 can be configured to switch from conveying one of one or more of corrected digital audio signals to conveying a second one of the one or more of corrected digital audio signals based on switching criteria comprising or associated with amplitude measurement, absolute value of the amplitude measurement, root-mean-square power measurement of digitized data associated with the one or more digital audio signals or one or more of the digital audio signals having a characteristic measurement above a threshold, for example, as further described herein, for example, regarding FIGS. 6-7, 14, etc. For instance, in a non-limiting aspect, exemplary implementations of system 100 comprising exemplary multipath digital audio combiner component 110 can facilitate providing threshold that can be adjustable based on a desired performance parameter associated with the exemplary system 100.

Figure 2:
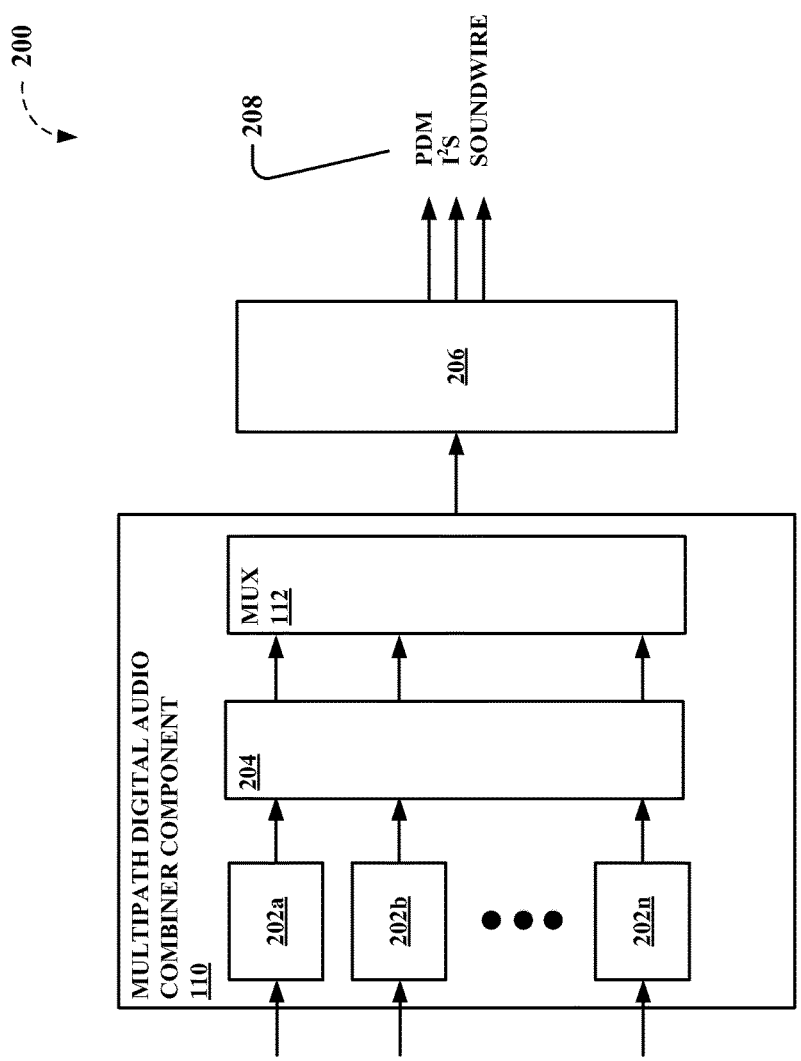
FIG. 2 depicts another functional block diagram of an exemplary multipath digital audio combiner component according to further non-limiting aspects of the subject disclosure.

FIG. 2 depicts another functional block diagram of an exemplary multipath digital audio combiner component 110 according to further non-limiting aspects of the subject disclosure. As a non-limiting example, an exemplary multipath digital audio combiner component 110 can comprise one or more of digital audio filters 202 (e.g., one or more of digital audio filters 202a, 202b, . . . , 202n, etc.) operatively coupled to one or more exemplary ADCs 108 (e.g., one or more of ADC 108a, 108b, . . . , 108n, etc.) (not shown). In a non-limiting aspect, the one or more of digital audio filters 202 can be configured to receive one or more of digital audio signals having different scaling factors of an associated audio signal and can be configured to provide one or more of filtered digital audio signals, as described herein, for example, regarding FIGS. 5, 11, etc. In a further non-limiting aspect, the one or more of digital audio filters 202 can comprise one or more decimators, one or more low pass filters, etc., as further described herein, regarding FIGS. 6-9.

Exemplary multipath digital audio combiner component 110 can further comprise an exemplary gain and offset estimation component 204 that can be configured to estimate one or more of gain differences or offset differences between the one or more filtered digital audio signals, for example, as described herein, regarding FIGS. 6-7, 12-13, etc. In a non-limiting aspect, exemplary multipath digital audio combiner component 110 can be configured to employ the one or more of gain differences or offset differences to scale one or more of the one or more of filtered digital audio signals to provide a scaled digital audio signal, and can be configured to adjust offset associated with the one or more of filtered digital audio signals, for example, as further described herein, regarding FIGS. 6-7, 12-13, etc. In other non-limiting aspects, exemplary gain and offset estimation component 204 can be further configured to perform one or more of a least squares estimation, a correlation-based estimation, etc. of the one or more of gain differences or offset differences. In addition, exemplary gain and offset estimation component 204 can be further configured to estimate the one or more of gain differences or offset differences on a continuous basis to account for temperature variations, in further non-limiting implementations described herein.

In addition, as further described above, exemplary multipath digital audio combiner component 110 can further comprise exemplary MUX component 112 that can be configured to switch from conveying one of the one or more corrected digital audio signals to conveying a second one of the one or more corrected digital audio signals. In a non-limiting aspect, exemplary multipath digital audio combiner 110 component can be further configured to perform gain and offset correction for the one or more filtered digital audio signals to provide the one or more corrected digital audio signals, for example, as further described herein, regarding FIGS. 6-7, 12-13, etc. In a further non-limiting aspect, multipath digital audio combiner component 110 can be further configured to control exemplary MUX component 112 to switch from conveying the one of the one or more of corrected digital audio signals to conveying the second one of the one or more of corrected digital audio signals based on one or more of the filtered digital audio signals having a characteristic measurement above a threshold, and/or based on one or more of amplitude measurement, absolute value of the amplitude measurement, root-mean-square power measurement, etc. of digitized data associated with the one or more of filtered digital audio signals, for example, as further described herein. In yet another non-limiting aspect, exemplary multipath digital audio combiner component 110 can be further configured to control exemplary MUX component 112 to switch from conveying the one of the one or more of corrected digital audio signals to conveying the second one of the one or more of corrected digital audio signals abruptly, gradually, based on a predefined algorithm, etc., for example, as further described herein regarding FIGS. 6-7, 14, etc.

In other non-limiting implementations, exemplary multipath digital audio combiner component 110 can comprise, be operatively coupled to, and/or be associated with an exemplary output component 206 that can be configured to transmit a digital signal 208 based on the one or more digital audio signals having different scaling factors of the associated audio signal. Thus, in non-limiting examples, an exemplary output component 206 can be configured to transmit a digital signal 208 comprising one or more of a pulse-density modulation (PDM) signal, an integrated interchip sound (I$^2$S) signal, and/or a Soundwire signal, etc. In further non-limiting examples, exemplary output component 206 can comprise one or more of a signal upsampler component (not shown), a signal reshaper component (not shown) that can be configured to provide the PDM signal, a decimation filter configured to provide the I$^2$S signal, etc., as further described herein, for example, as described below regarding FIGS. 7-8.

To these and/or related ends, various aspects of multipath digital microphone are described. For example, the various embodiments of the apparatuses, techniques, and methods of the subject disclosure are described in the context of digital two-path microphone microphones, etc. However, as further detailed below, various exemplary implementations can be applied to other areas of multipath digital microphone design, without departing from the subject matter described herein.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures and devices are shown in block diagram form to facilitate description and illustration of the various embodiments. In addition, some depicted digital blocks, steps, or functionalities may be omitted in an actual implementation, and/or the order of the digital blocks, steps, or functionalities may be rearranged.

Figure 3:
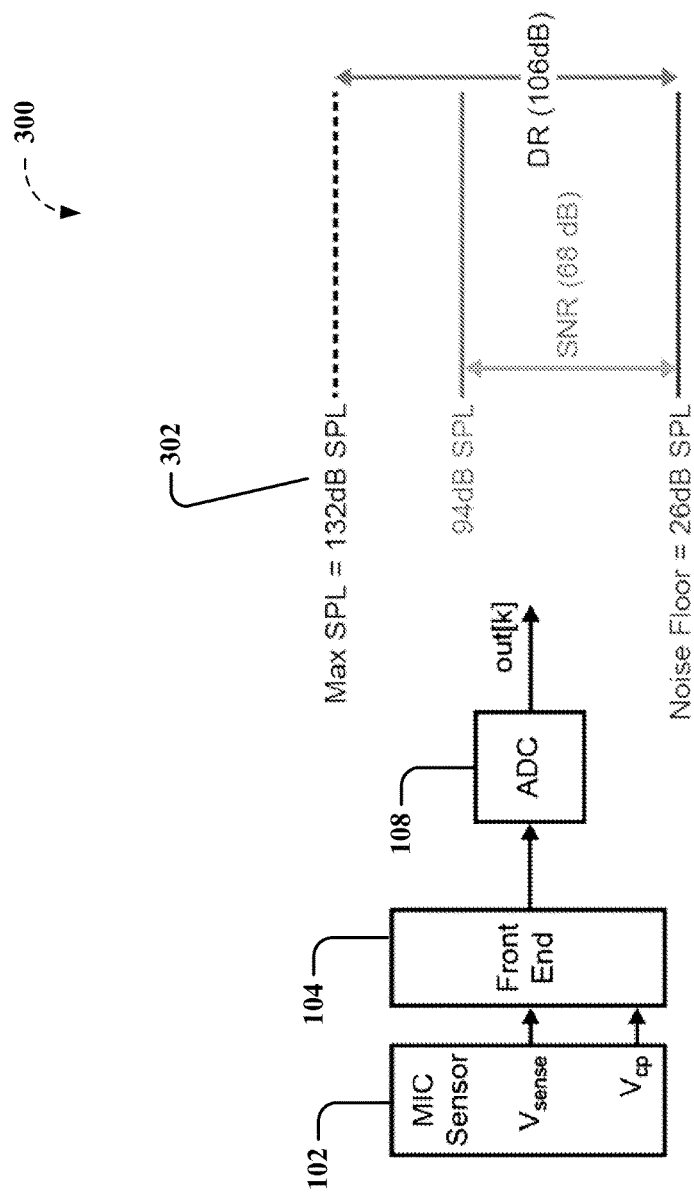
FIG. 3 depicts a functional block diagram of an exemplary digital microphone system digitized by means of a high performance analog-to-digital converter (ADC) that illustrates non-limiting aspects as described herein.

FIG. 3 depicts a functional block diagram of an exemplary digital microphone system 300 digitized by means of a high performance ADC 108 that illustrates non-limiting aspects as described herein. For instance, as shown in FIG. 3, exemplary digital microphone system 300 can comprise one of exemplary MEMS acoustic or microphone sensors 102 (e.g., MEMS acoustic or microphone sensor 102a, 102b, . . . , 102n, etc.) operatively coupled to one or more components or circuitry 104 (e.g., one or more of components or circuitry 104a, 104b, . . . 104n, etc.) or front end and an exemplary ADC 108 (e.g., ADC 108a, 108b, . . . , 108n, etc.). As depicted in FIG. 3, achievement of a SNR of 68 dB with a maximum input signal of 132 dB SPL leads to a large dynamic range requirement of 106 dB for exemplary ADC 108. In practice, the achievement of such a large dynamic range for an exemplary ADC 108 (e.g., employing a high performance ADC 108) would result in excessive power consumption in many typical digital microphone applications.

Figure 4:
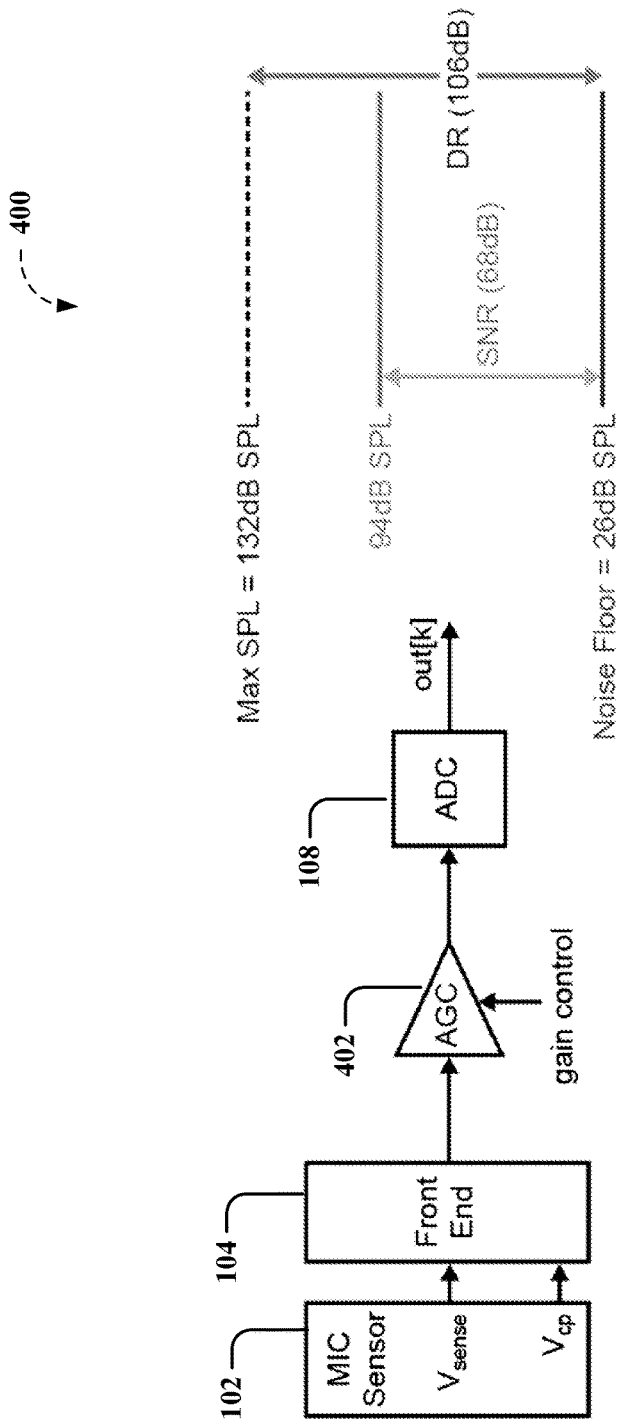
FIG. 4 depicts another functional block diagram of an exemplary digital microphone system digitized by means of an automatic gain control (AGC) amplifier that illustrates further non-limiting aspects as described herein.

FIG. 4 depicts another functional block diagram of an exemplary digital microphone system 400 digitized by means of an automatic gain control (AGC) amplifier 402 that illustrates further non-limiting aspects as described herein. In order to reduce the dynamic range requirement of exemplary ADC 108, AGC amplifier 402 gain can be automatically adjusted according to the instantaneous signal strength of the input audio signal. This allows the exemplary ADC 108 to have significantly lower DR while still meeting the desired maximum SPL and noise floor levels of the exemplary digital microphone system 400. However, it can be understood that AGC signal must change relatively slowly in order to avoid audible artifacts, which constraint can lead to instantaneous saturation of the audio signal at the output of AGC amplifier 402. In addition, an algorithm by which the AGC responds to input signal variations often requires many user defined parameters, which can lead to undesired complexity in many typical digital microphone applications. While the exemplary digital microphone systems 300 and 400 are described herein for the purpose of illustration, and not limitation, it can be understood that digital microphone systems 300 and 400, and/or portions thereof, can be employed as portions of multipath digital microphone systems, as further described herein. For instance, while exemplary embodiments described in reference to FIGS. 5-7, for example, are described having fixed gain values associated with the ADCs, the various embodiments described herein are not so limited. As a further non-limiting example, by utilizing techniques associated with a conventional AGC approach, an amplifier in a given path of exemplary embodiments can avoid or limit its time in saturation by utilizing a lower gain setting when its signal level is sufficiently high and/or can utilize a higher gain setting when saturation is no longer of concern.

Figure 5:
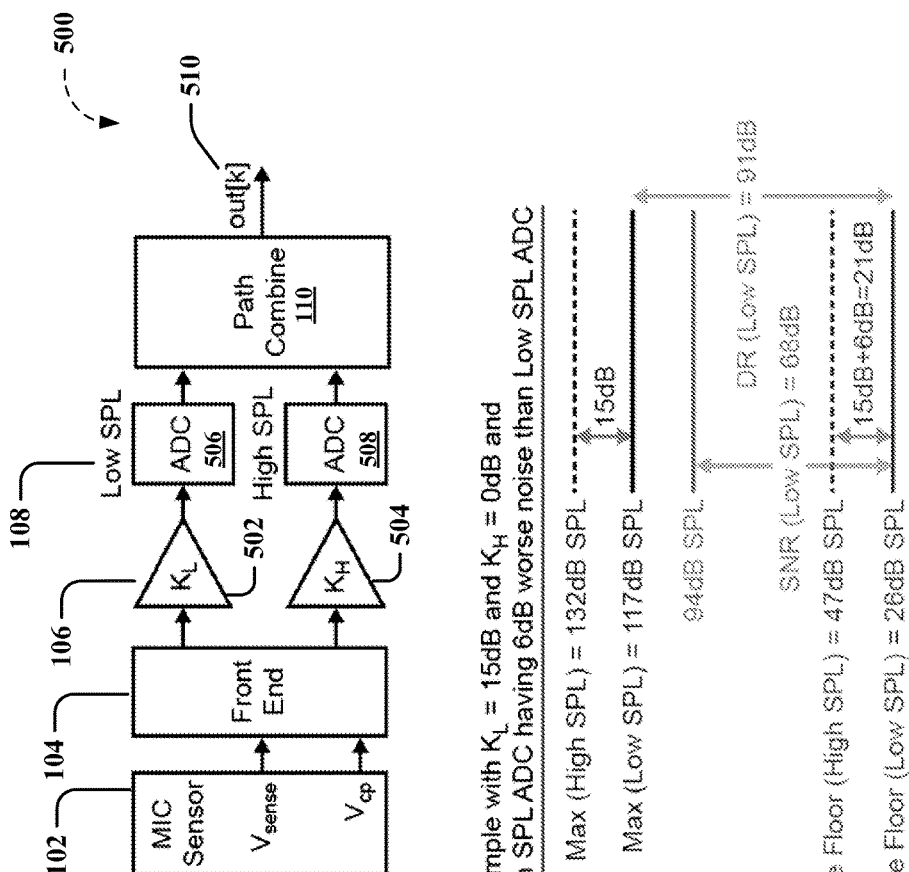
FIG. 5 depicts a functional block diagram of an exemplary digital microphone system comprising a non-limiting implementation of a two-path digital combiner audio combiner component according to aspects of the subject disclosure.

As a non-limiting example, FIG. 5 depicts a functional block diagram of an exemplary digital microphone system 500 comprising a non-limiting implementation of a two-path digital combiner audio combiner component 110 according to aspects of the subject disclosure. For instance, as described above regarding FIGS. 1-2, exemplary digital microphone system 500 can comprise one or more exemplary MEMS acoustic or microphone sensors 102 (e.g., one or more of MEMS acoustic or microphone sensor 102a, 102b, . . . , 102n, etc operatively coupled to one or more components or circuitry 104 (e.g., one or more of components or circuitry 104a, 104b, . . . , 104n, etc.), or front end, one or more exemplary preamplifiers 106 (e.g., one or more of preamplifiers 106a, 106b, . . . , 106n, etc.) operatively coupled to the one or more output associated with the one or more components or circuitry 104 (e.g., one or more of components or circuitry 104a, 104b, . . . , 104n, etc.), one or more exemplary ADCs 108 (e.g., one or more of ADC 108a, 108b, ..., 108n, etc.) operatively coupled to one or more outputs associated with the one or more preamplifiers 106, and/or an exemplary multipath digital audio combiner component 110 operatively coupled to one or more outputs associated with the one or more ADCs 108 (e.g., outputs associated with the one or more of ADC 108a, 108b, ..., 108n, etc.).

In FIG. 5, exemplary digital microphone system 500 is depicted as digital two-path microphone system that can employ a single MEMS acoustic or microphone sensor 102 and a single front end 104 coupled to a Low SPL path (e.g., comprising exemplary preamplifier/buffer 502 and exemplary ADC 506) and a High SPL path (e.g., comprising exemplary preamplifier/buffer 504 and exemplary ADC 508), with the outputs of exemplary ADC 506 and ADC 508 coupled to exemplary multipath digital audio combiner component 110, which provides an exemplary path combiner output, out[k] (510). In a non-limiting aspect, the Low SPL path can have a gain value, $K_L$ (e.g., 15 dB, in the non-limiting example, etc.), chosen to meet the desired noise floor for low audio signals, and the High SPL path can have a gain value, $K_H$ (e.g., 0 dB, in the non-limiting example, etc.), chosen to meet the Max SPL level required of the overall digital microphone. In a further non-limiting aspect, the value of $K_L$ can be greater than the value of $K_H$. In addition, unlike in an AGC approach described above regarding FIG. 3, these gain values, $K_H$ and $K_L$, can be nominally static rather than varying according to the input signal levels (though their values may be changed under different operating modes of the digital microphone) and/or can incorporate aspects of an AGC approach, in a further non-limiting aspect. For instance, rather than changing a gain value according to the input audio signal level as done in AGC systems, an exemplary multipath digital audio combiner component 110, as described herein, can be configured to select an ADC output from the Low SPL path or the High SPL path according to an input audio signal level.

As a further non-limiting example, for small input audio signal levels, the Low SPL path output can be chosen (e.g., by exemplary multipath digital audio combiner component 110 or portions thereof) for output to exemplary path combiner output, out[k] (510), but when the input audio signal level is close to exceeding the Max SPL range of the Low SPL path, exemplary multipath digital audio combiner component 110 can be further configured to select the High SPL path for output to exemplary path combiner output, out[k] (510). In a non-limiting aspect, selection from Low SPL path to High SPL path can be instantaneous, and as a result, saturation effects in the Low SPL path can be eliminated from influencing the overall exemplary digital microphone system 500 output at exemplary path combiner output, out[k] (510). In a further non-limiting aspect, exemplary multipath digital audio combiner component 110 can employ exemplary algorithms, for example, as described herein regarding FIGS. 6-7, 14, etc., which can be designed to require very little user configuration, thereby providing a simple use model of exemplary implementations of a digital microphone system 500.

In a further non-limiting aspect, to reduce power, one can generally design an exemplary High SPL path amplifier (e.g., exemplary preamplifier/buffer 504) and ADC (e.g., exemplary ADC 508) to have higher noise than the Low SPL path amplifier (e.g., exemplary preamplifier/buffer 502) and ADC (e.g., exemplary ADC 506). In the non-limiting example shown in FIG. 5, it is assumed that the High SPL path ADC (e.g., exemplary ADC 508) is designed to have 6 dB worse noise than the Low SPL path ADC (e.g., exemplary ADC 506), which allows the High SPL path ADC (e.g., exemplary ADC 508) to be implemented with significantly lower power consumption than the Low SPL path ADC (e.g., exemplary ADC 506). However, due to the higher ADC noise and reduced amplifier gain in the High SPL path (e.g., exemplary ADC 506), the noise floor increases by 21 dB (6 dB from the increased ADC noise plus 15 dB from the difference in amplifier gains or $K_L$ less $K_H$) when sending the High SPL path High SPL path (e.g., comprising exemplary preamplifier/buffer 504 and exemplary ADC 508) to the overall microphone output (e.g., exemplary path combiner output, out[k] (510)) rather than the Low SPL path Low SPL path (e.g., comprising exemplary preamplifier/buffer 502 and exemplary ADC 506). It can be understood that this increase in noise floor will be acceptable for many audio applications since the High SPL path High SPL path (e.g., comprising exemplary preamplifier/buffer 504 and exemplary ADC 508) is only activated when large audio signals occur, according to various non-limiting embodiments described herein. Thus, the overall digital microphone as depicted regarding exemplary digital microphone system 500 is able to achieve a large DR without requiring a large DR ADC, which, in turn, enables a relatively low power digital microphone implementation that can achieve similar DR, for example, as an analog microphone.

Figure 6:
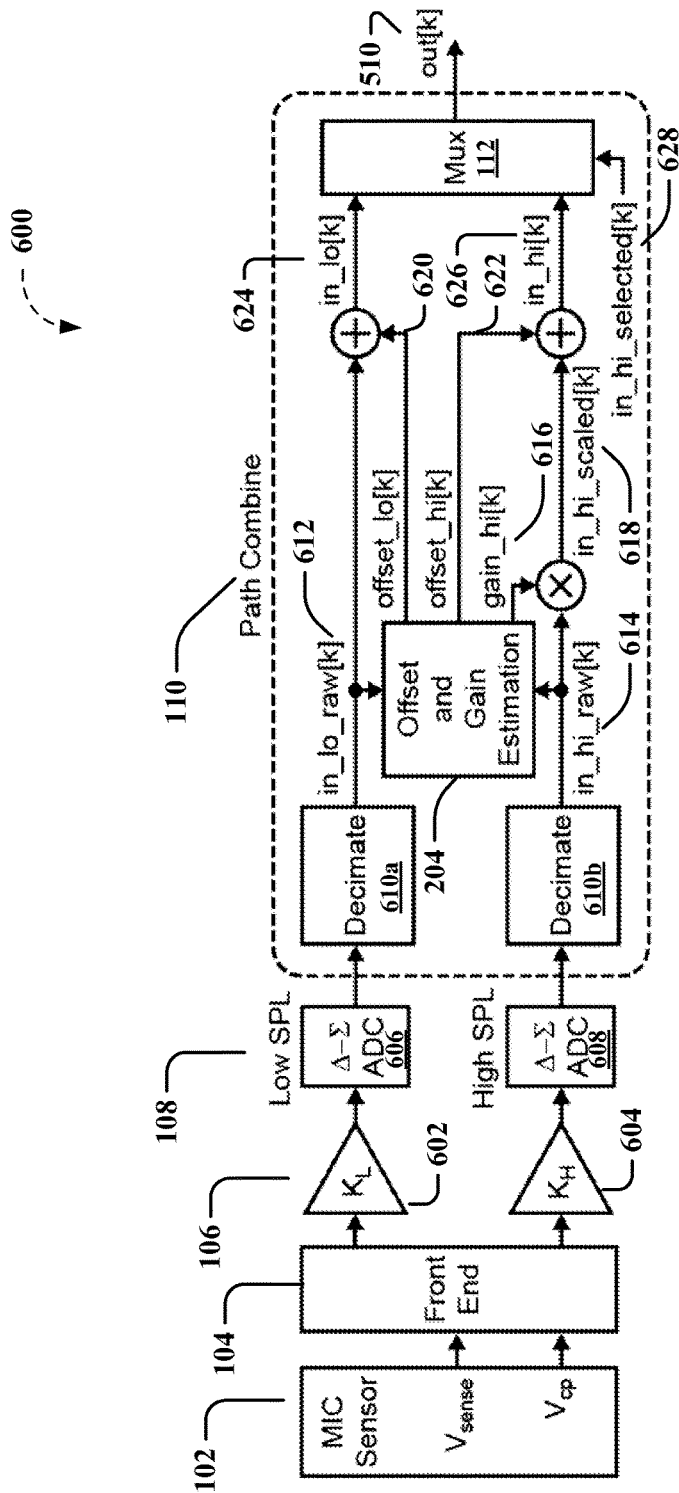
FIG. 6 depicts a functional block diagram of an exemplary digital microphone system comprising an exemplary multipath digital audio combiner component according to aspects of the subject disclosure.

FIG. 6 depicts a functional block diagram of an exemplary digital microphone system 600 comprising an exemplary multipath digital audio combiner component 110 according to aspects of the subject disclosure. For example, as described above regarding FIGS. 1-2 and 5, exemplary digital microphone system 600 can comprise one or more exemplary MEMS acoustic or microphone sensors 102 (e.g., one or more of MEMS acoustic or microphone sensor 102a, 102b, ..., 102n, etc operatively coupled to one or more components or circuitry 104 (e.g., one or more of components or circuitry 104a, 104b, ..., 104n, etc.), or front end, one or more exemplary preamplifiers 106 (e.g., one or more of preamplifiers 106a, 106b, ..., 106n, etc., such as preamplifiers 602, 604) operatively coupled to the one or more output associated with the one or more components or circuitry 104 (e.g., one or more of components or circuitry 104a, 104b, ..., 104n, etc.), one or more exemplary ADCs 108 (e.g., one or more of ADC 108a, 108b, ..., 108n, etc., such as ADCs 606, 608) operatively coupled to one or more outputs associated with the one or more preamplifiers 106, and/or an exemplary multipath digital audio combiner component 110 operatively coupled to one or more outputs associated with the one or more ADCs 108 (e.g., outputs associated with the one or more of ADC 108a, 108b, ..., 108n, etc., such as output associated with ADCs 606, 608). As described above regarding FIG. 5, exemplary digital microphone system 600 is depicted as digital two-path microphone system that can employ a single MEMS acoustic or microphone sensor 102 and a single front end 104 coupled to a Low SPL path (e.g., comprising exemplary preamplifier/buffer 602 and exemplary ADC 606) and a High SPL path (e.g., comprising exemplary preamplifier/buffer 604 and exemplary ADC 608), with the outputs of exemplary ADC 606 and ADC 608 coupled to exemplary multipath digital audio combiner component 110, which provides an exemplary path combiner output, out[k] (510).

In a non-limiting aspect, exemplary digital microphone system 600 can comprise exemplary ADC 606 and ADC 608 employing a Delta-Sigma (Δ-Σ) architecture, in which the sample rate of the ADC is much higher than the bandwidth of the audio signal, and in which a significant amount of high frequency quantization noise can be present in the ADC output (e.g., output of exemplary ADC 606 and ADC 608). As further described above regarding FIG. 2, exemplary multipath digital audio combiner component 110 can comprise one or more of digital audio filters 202 (e.g., one or more of digital audio filters 202a, 202b, . . . , 202n, etc.) operatively coupled to one or more exemplary ADCs 108 (e.g., one or more of ADC 108a, 108b, . . . , 108n, etc., such as ADCs 606, 608). As described herein, the one or more of digital audio filters 202 can be configured to receive one or more of digital audio signals having different scaling factors of an associated audio signal and can be configured to provide one or more of filtered digital audio signals, as described herein. Accordingly, in a further non-limiting aspect, the one or more of digital audio filters 202 can comprise one or more decimators 610 (e.g., decimator 610a, 610b, etc.). Thus, exemplary digital microphone system 600 comprising an exemplary multipath digital audio combiner component 110 can comprise one or more exemplary decimators 610 (e.g., decimator 610a, 610b, etc.) configured to reduce the impact of Δ-Σ quantization noise. In further non-limiting aspect, the one or more exemplary decimators 610 (e.g., decimator 610a, 610b, etc.) can also lower the clock rate of path combine digital circuits associated with exemplary multipath digital audio combiner component 110. As a result, outputs of exemplary ADC 606 and ADC 608 can be decimated to produce signals in_lo_raw[k] (612) and in_hi_raw[k] (614) as indicated in FIG. 6.

As further described above regarding FIG. 2, exemplary multipath digital audio combiner component 110 can comprise an exemplary gain and offset estimation component 204 that can be configured to estimate one or more of gain differences or offset differences between the one or more filtered digital audio signals. In a non-limiting aspect, exemplary multipath digital audio combiner component 110 can be configured to employ the one or more of gain differences or offset differences to scale one or more of the one or more of filtered digital audio signals to provide a scaled digital audio signal, and can be configured to adjust offset associated with the one or more of filtered digital audio signals. As a non-limiting example, exemplary gain and offset estimation component 204 can be configured to utilize information in in_lo_raw[k] (612) and in_hi_raw[k] (614) to estimate the gain and/or offset differences between each of these signals (e.g., in_lo_raw[k] (612) and in_hi_raw[k] (614)). In a further non-limiting aspect, a gain difference estimate can be employed to form a gain_hi[k] (616) signal to facilitate scaling the in_hi_raw[k] signal (614), with the resulting in_hi_scaled[k] (618) signal then having a matched scale factor to the in_lo_raw[k] (612) signal. While for purposes of illustration FIG. 6 is shown as facilitating the scaling the in_hi_raw[k] signal (614), in other non-limiting implementations, a scale factor can be applied in_lo_raw[k] (612) instead of or in addition to applying the scale factor gain_hi[k] (616) to the in_hi_raw[k] (614) signal.

In yet another non-limiting aspect, in addition to gain estimation, exemplary gain and offset estimation component 204 can be configured to utilize information in in_lo_raw[k] (612) and in_hi_raw[k] (614) to facilitate estimating offset differences, to facilitate adding offset_lo[k] (620) to in_lo_raw[k] (612) and facilitate adding offset_hi[k] (622) to in_hi_scaled[k] (618). It can be understood that exemplary offset_lo[k] (620) and exemplary offset_hi[k] (622) signals can be configured to correct for offset differences between the High SPL path (e.g., comprising exemplary preamplifier/buffer 604 and exemplary ADC 608) and Low SPL path (e.g., comprising exemplary preamplifier/buffer 602 and exemplary ADC 606), for example, during times that exemplary multipath digital audio combiner component 110 switches exemplary path combiner output, out[k] (510), from conveying one of one or more of corrected digital audio signals (e.g., one of in_lo[k] (624) or in_hi[k] (626)) to conveying a second one of the one or more of corrected digital audio signals (e.g., the other of in_lo[k] (624) or in_hi[k] (626)).

For example, as further described above regarding FIGS. 1-2, for example, an exemplary MUX component 112 can be configured to switch from conveying one of one or more of corrected digital audio signals (e.g., one of in_lo[k] (624) or in_hi[k] (626)) to conveying a second one of the one or more of corrected digital audio signals (e.g., the other of in_lo[k] (624) or in_hi[k] (626)) based on one or more switching criteria determined by an exemplary multipath digital audio combiner component 110. As a non-limiting example, an exemplary MUX component 112 can be configured to switch from conveying one of one or more of corrected digital audio signals to conveying a second one of the one or more of corrected digital audio signals based on switching criteria comprising or associated with amplitude measurement, absolute value of the amplitude measurement, root-mean-square power measurement of digitized data associated with the one or more digital audio signals or one or more of the digital audio signals having a characteristic measurement above a threshold, for example, as further described herein. Accordingly, exemplary path combiner output, out[k] (510), can be switched from conveying one of one or more of corrected digital audio signals (e.g., one of in_lo[k] (624) or in_hi[k] (626)) to conveying a second one of the one or more of corrected digital audio signals (e.g., the other of in_lo[k] (624) or in_hi[k] (626)) (e.g., switched from the Low SPL path, comprising exemplary preamplifier/buffer 602 and exemplary ADC 606, to the High SPL path, comprising exemplary preamplifier/buffer 604 and exemplary ADC 608), via exemplary MUX component 112 that is fed by the gain and offset corrected signals for each path, in_lo[k] (624) and in_hi[k] (626), and controlled by an exemplary in_hi_selected[k] signal (628). The details of how the in_hi_selected (628) signal is determined are further described herein, regarding FIGS. 14 and 16, for example. For example, exemplary simulated results of an exemplary digital microphone system 600 comprising an exemplary multipath digital audio combiner component 110 configured as a non-limiting implementation of two-path digital audio combiner component 110 are described below regarding FIG. 16.

Figure 7:
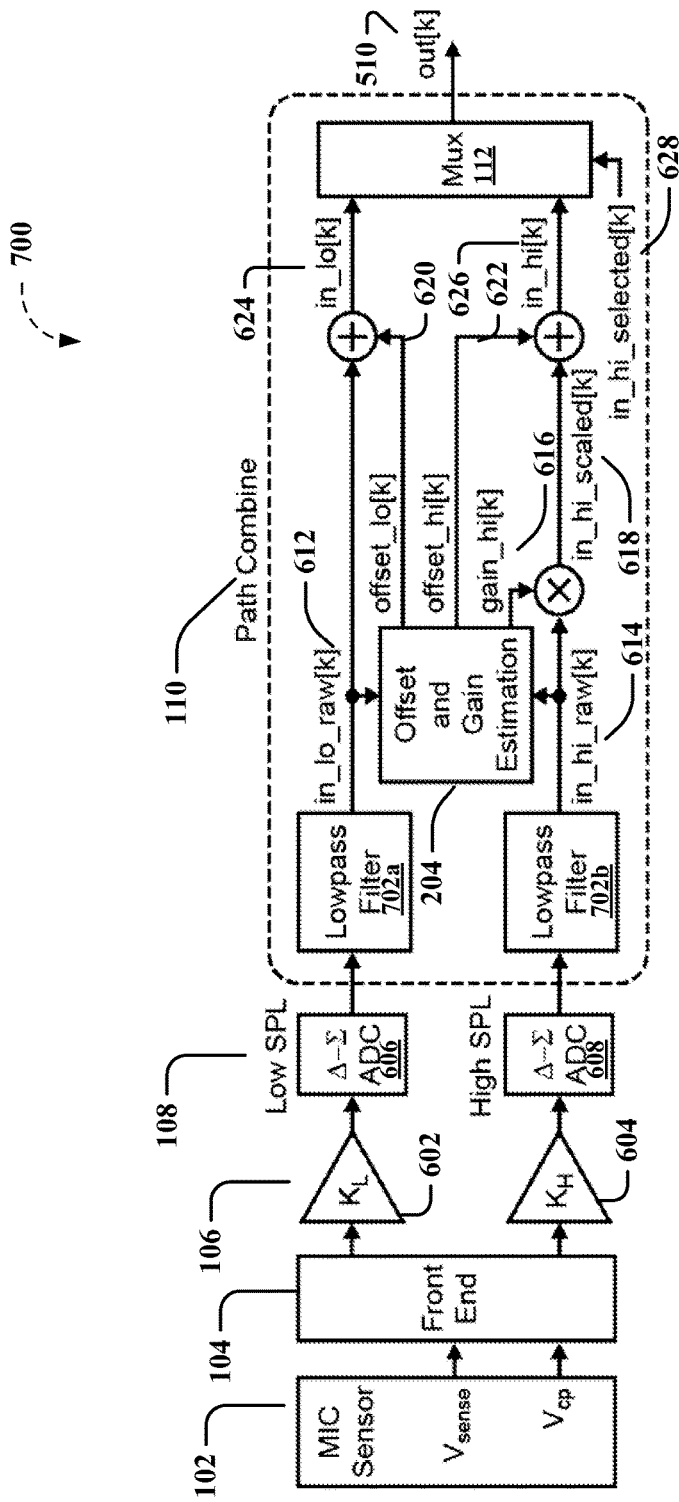
FIG. 7 depicts another functional block diagram of an exemplary digital microphone system comprising another exemplary multipath digital audio combiner component according to further aspects of the subject disclosure.

FIG. 7 depicts another functional block diagram of an exemplary digital microphone system 700 comprising another exemplary multipath digital audio combiner component 110 according to further aspects of the subject disclosure. For example, as described above regarding FIGS. 1-2 and 5-6, exemplary digital microphone system 700 can comprise one or more exemplary MEMS acoustic or microphone sensors 102 (e.g., one or more of MEMS acoustic or microphone sensor 102a, 102b, . . . , 102n, etc operatively coupled to one or more components or circuitry 104 (e.g., one or more of components or circuitry 104a, 104b, . . . , 104n, etc.), or front end, one or more exemplary preamplifiers 106 (e.g., one or more of preamplifiers 106a, 106b, . . . , 106n, etc., such as preamplifiers 602, 604) operatively coupled to the one or more output associated with the one or more components or circuitry 104 (e.g., one or more of components or circuitry 104a, 104b, . . . , 104n, etc.), one or more exemplary ADCs 108 (e.g., one or more of ADC 108a, 108b, . . . , 108n, etc., such as ADCs 606, 608) operatively coupled to one or more outputs associated with the one or more preamplifiers 106, and/or an exemplary multipath digital audio combiner component 110 operatively coupled to one or more outputs associated with the one or more ADCs 108 (e.g., outputs associated with the one or more of ADC 108*a*, 108*b*, . . . , 108*n*, etc., such as output associated with ADCs 606, 608). As described above regarding FIGS. 5-6, exemplary digital microphone system 700 is depicted as digital two-path microphone system that can employ a single MEMS acoustic or microphone sensor 102 and a single front end 104 coupled to a Low SPL path (e.g., comprising exemplary preamplifier/buffer 602 and exemplary ADC 606) and a High SPL path (e.g., comprising exemplary preamplifier/buffer 604 and exemplary ADC 608), with the outputs of exemplary ADC 606 and ADC 608 coupled to exemplary multipath digital audio combiner component 110, which provides an exemplary path combiner output, out[k] (510).

As further described above regarding FIG. 2, exemplary multipath digital audio combiner component 110 can comprise one or more of digital audio filters 202 (e.g., one or more of digital audio filters 202*a*, 202*b*, . . . , 202*n*, etc.) operatively coupled to one or more exemplary ADCs 108 (e.g., one or more of ADC 108*a*, 108*b*, . . . , 108*n*, etc., such as ADCs 606, 608). As described herein, the one or more of digital audio filters 202 can be configured to receive one or more of digital audio signals having different scaling factors of an associated with an audio signal and can be configured to provide one or more of filtered digital audio signals, as described herein. Accordingly, in a further non-limiting aspect, the one or more of digital audio filters 202 can comprise one or more low pass filters 702 (e.g., low pass filter 702*a*, 702*b*, etc.). In a non-limiting aspect, exemplary low pass filters can facilitate reducing $\Delta\text{-}\Sigma$ quantization noise, but can maintain the same ADC clock rate (e.g., clock rate associated with ADCs 606, 608), rather than a reduced clock rate, as described above regarding FIG. 6, for the in_low_raw[k] (612) and in_hi_raw[k] (614) signals. For instance, exemplary low pass filters 702 can facilitate reduced signal processing delay through the exemplary multipath digital audio combiner component 110, as compared to exemplary multipath digital audio combiner component 110 employing decimators 610, for example. In addition, exemplary multipath digital audio combiner component 110 employing exemplary low pass filters 702 can facilitate providing a PDM output without an upsampler, for example, as further described below regarding FIGS. 8-9. However, an exemplary multipath digital audio combiner component 110 employing exemplary low pass filters 702 can be associated with higher power consumption, for example, because path combine digital circuits associated with exemplary multipath digital audio combiner component 110 operate at a higher clock frequency compared to an exemplary multipath digital audio combiner component 110 employing decimators 610, as described above regarding FIG. 6.

Figure 8:
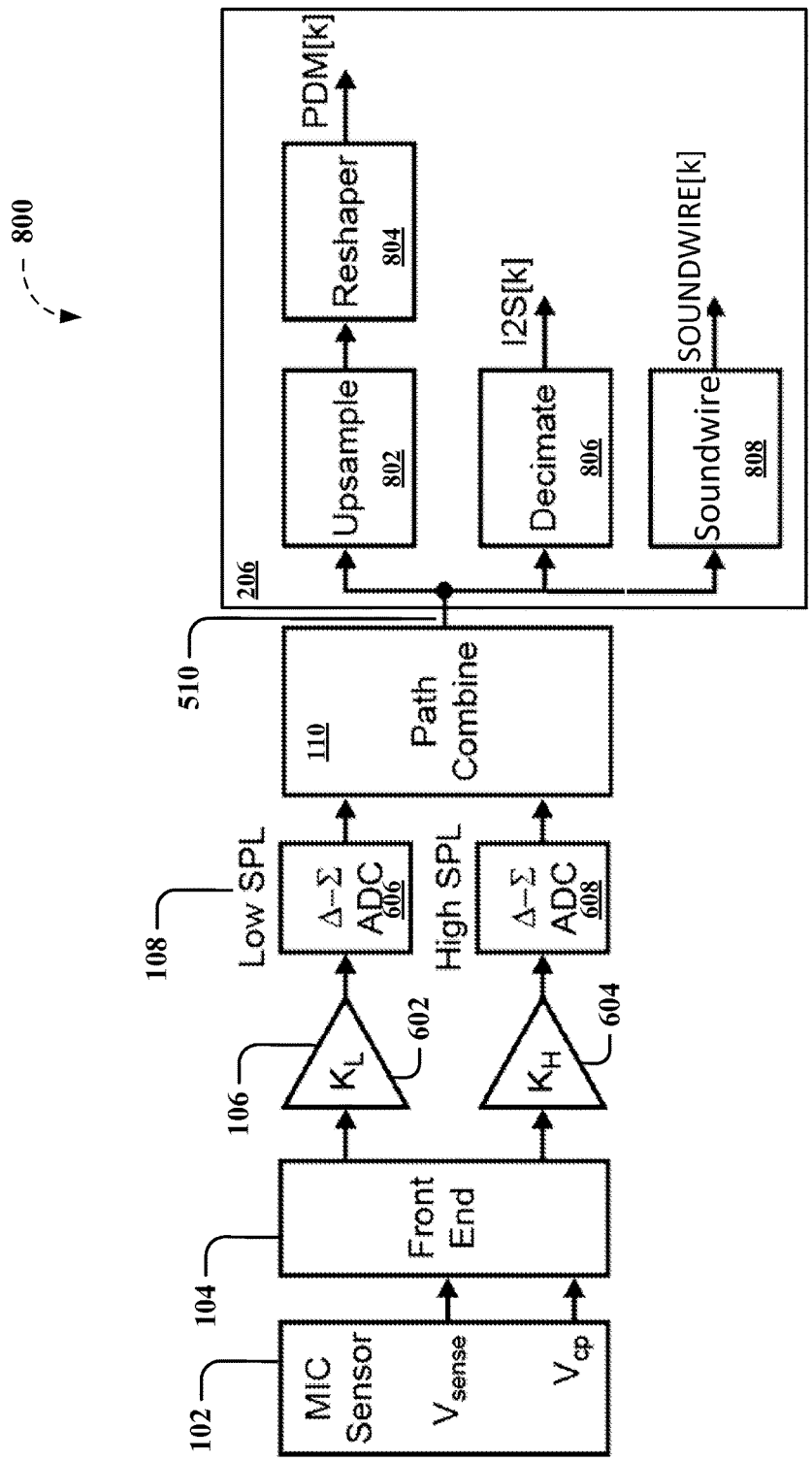
FIG. 8 depicts a functional block diagram of an exemplary digital microphone system comprising an exemplary output component according to aspects of the subject disclosure.
Figure 9:
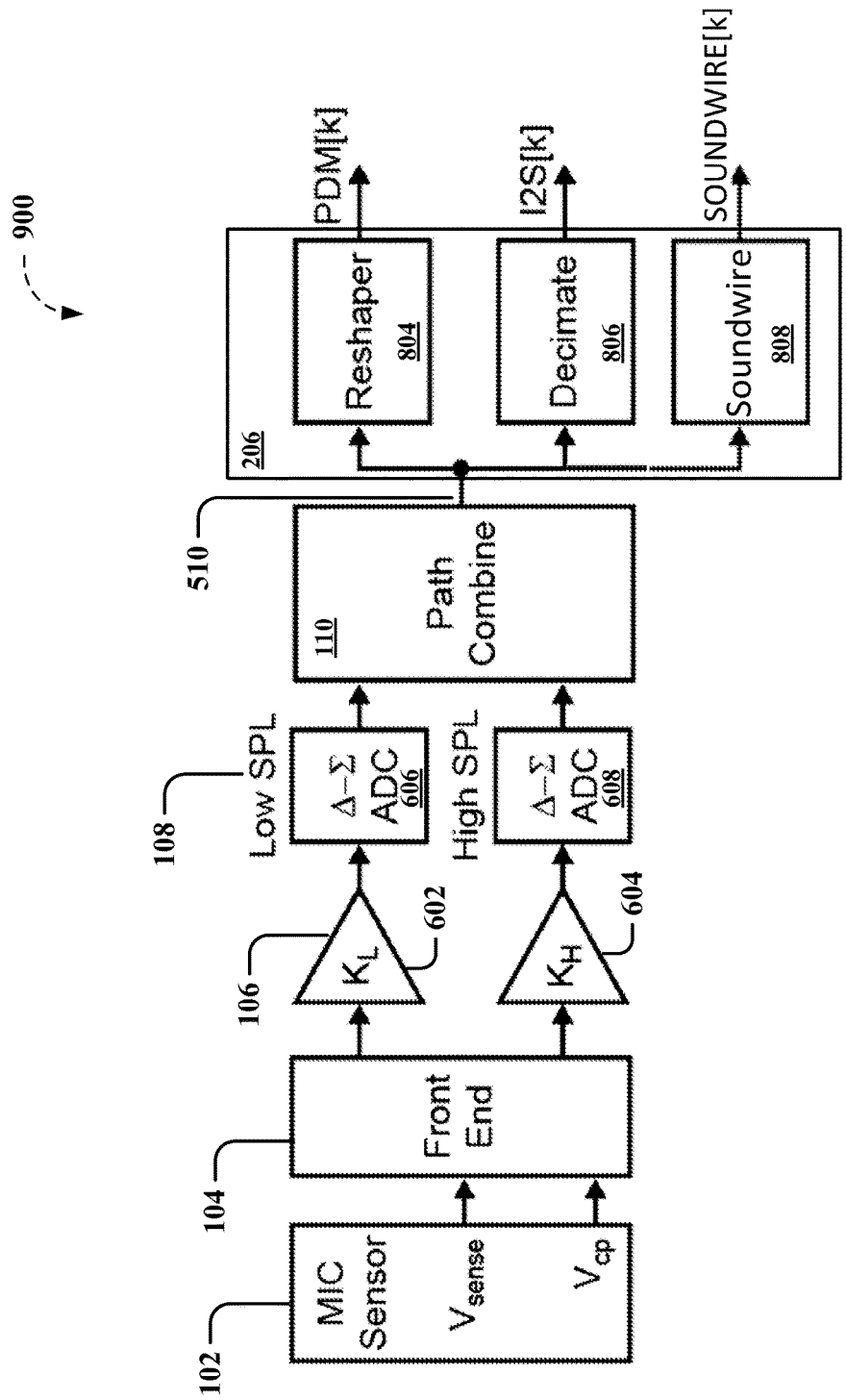
FIG. 9 depicts another functional block diagram of an exemplary digital microphone system comprising a further exemplary output component according to aspects of the subject disclosure.

FIG. 8 depicts a functional block diagram of an exemplary digital microphone system 800 comprising an exemplary output component 206 according to aspects of the subject disclosure. FIG. 9 depicts another functional block diagram of an exemplary digital microphone system 900 comprising a further exemplary output component 206 according to aspects of the subject disclosure. For example, as described above regarding FIG. 2, exemplary multipath digital audio combiner component 110 can comprise, be operatively coupled to, and/or be associated with an exemplary output component 206 that can be configured to transmit a digital signal 208 based on the one or more digital audio signals having different scaling factors of the associated audio signal. Thus, in non-limiting examples, an exemplary output component 206 can be configured to transmit a digital signal comprising one or more of a PDM signal, an I²S signal, and/or a Soundwire signal, etc. In further non-limiting examples, exemplary output component 206 can comprise one or more of a signal upsampler component 802, a signal reshaper component 804 that can be configured to provide the PDM signal, a decimation filter 806 configured to provide the I²S signal, components and/or circuitry for Soundwire signal production 808, etc. As a non-limiting example involving PDM signals, an exemplary output sample rate could be the same as the $\Delta\text{-}\Sigma$ ADC sample rate (e.g., sample rate of ADCs 606, 608). Accordingly, as depicted in FIG. 8, exemplary signal upsampler component 802 can be employed in exemplary digital microphone systems comprising exemplary multipath digital audio combiner component 110 that utilizes decimation as described above regarding FIG. 6. Alternatively, exemplary signal upsampler component 802 would be unnecessary in exemplary digital microphone systems comprising exemplary multipath digital audio combiner component 110 that utilizes low pass filtering without decimation to provide a PDM output as described above regarding FIG. 7. In another non-limiting aspect, an exemplary decimation filter 806 can facilitate providing I²S format signals based on exemplary path combiner output, out[k] (510) from exemplary multipath digital audio combiner component 110.

Figure 10:
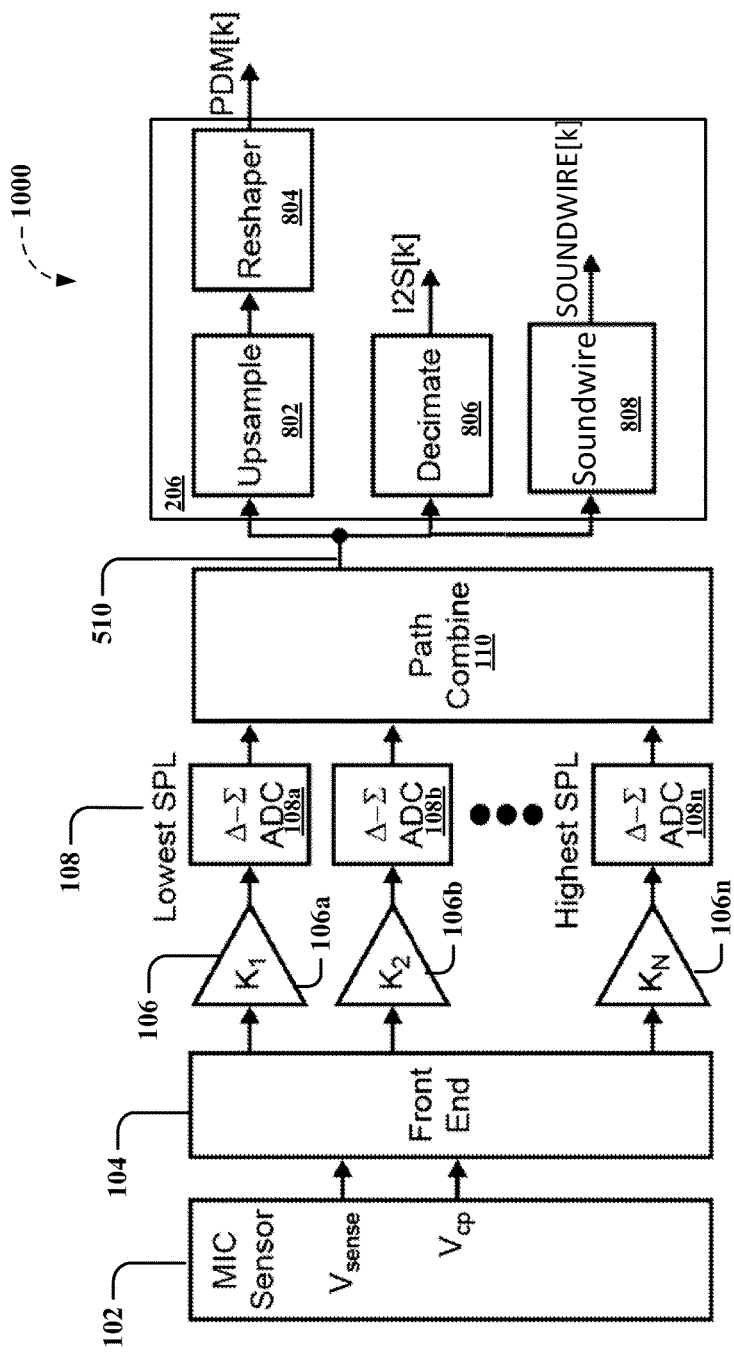
FIG. 10 depicts another functional block diagram of an exemplary digital microphone system comprising a single microphone sensor, an exemplary multipath digital audio combiner component, and exemplary output component according to further non-limiting aspects of the subject disclosure.

FIG. 10 depicts another functional block diagram of an exemplary digital microphone system 1000 comprising a single microphone sensor, an exemplary multipath digital audio combiner component 110, and exemplary output component 206 according to further non-limiting aspects of the subject disclosure. For example, as described above regarding FIGS. 1-2 and 5-6, etc., exemplary digital microphone system 1000 can comprise one or more exemplary MEMS acoustic or microphone sensors 102 (e.g., one or more of MEMS acoustic or microphone sensor 102*a*, 102*b*, . . . , 102*n*, etc operatively coupled to one or more components or circuitry 104 (e.g., one or more of components or circuitry 104*a*, 104*b*, . . . , 104*n*, etc.), or front end, one or more exemplary preamplifiers 106 (e.g., one or more of preamplifiers 106*a*, 106*b*, . . . , 106*n*, etc.) operatively coupled to the one or more output associated with the one or more components or circuitry 104 (e.g., one or more of components or circuitry 104*a*, 104*b*, . . . , 104*n*, etc.), one or more exemplary ADCs 108 (e.g., one or more of ADC 108*a*, 108*b*, . . . , 108*n*, etc.) operatively coupled to one or more outputs associated with the one or more preamplifiers 106, and/or an exemplary multipath digital audio combiner component 110 operatively coupled to one or more outputs associated with the one or more ADCs 108 (e.g., outputs associated with the one or more of ADC 108*a*, 108*b*, . . . , 108*n*, etc.).

In contrast to that described above regarding FIG. 5-6, exemplary digital microphone system 1000 is depicted as a digital multipath microphone system that can employ a single MEMS acoustic or microphone sensor 102 and a single front end 104 coupled to multiple SPL paths from the lowest SPL path (e.g., comprising exemplary preamplifier/buffer 106*a* and exemplary ADC 108*a*) to the highest SPL path (e.g., comprising exemplary preamplifier/buffer 106*n* and exemplary ADC 108*n*), with the outputs of exemplary ADCs 108 coupled to exemplary multipath digital audio combiner component 110, which provides an exemplary path combiner output, out[k] (510). Thus, exemplary digital two-path architectures, for example, as described above regarding FIGS. 5-7, can be generalized to a multipath architecture as shown in FIG. 8, and/or as described above regarding FIGS. 1-2, etc. Accordingly, various non-limiting embodiments described herein can facilitate providing reduced change in noise levels when switching between paths by having more than two signal paths. For instance, in the exemplary two-path architecture described above regarding FIG. 5, switching from Low SPL path (e.g., comprising exemplary preamplifier/buffer 502 and exemplary ADC 506) to High SPL path (e.g., comprising exemplary preamplifier/buffer 504 and exemplary ADC 508) leads to a 21 dB increase in noise floor. However, as a non-limiting example, if three signal paths were utilized rather than two, then the difference in noise floors from one path to the next could be reduced while still maintaining the same overall dynamic range for in the exemplary digital microphone system 1000. However, it is noted that exemplary digital microphone system 1000, employing more than two paths can be associated with increased power consumption and area in an overall microphone implementation.

While, exemplary digital microphone system 1000 is depicted as a digital multipath microphone system that employing a single MEMS acoustic or microphone sensor 102 and a single front end 104 coupled to multiple SPL paths, various non-limiting embodiments of the subject disclosure are not so limited. In a non-limiting aspect, exemplary digital microphone system 1000 can comprise more than one MEMS acoustic or microphone sensors 102 configured to receive one or more of the acoustic signal or a variation associated with the acoustic signal (e.g., such as the acoustic signal varied by differences in time, location, acoustic path, etc.) or can be comprised of any number of disparate transducer structures (e.g., numbers and/or configuration of membranes, etc.), any number of front end circuit designs (e.g., supplying variable charge pump voltages, etc.), for example, as describe above regarding FIGS. 1-11, etc.

Figure 11:
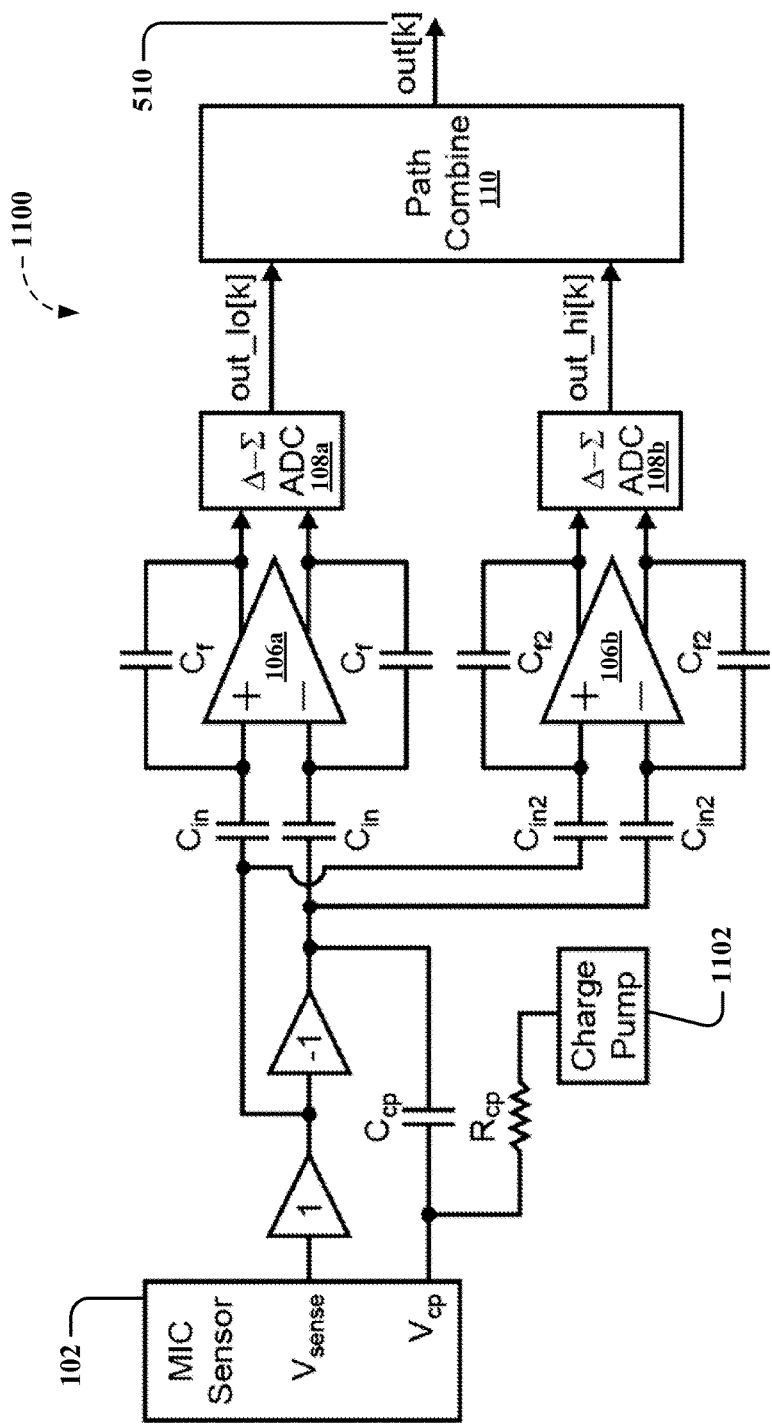
FIG. 11 depicts an exemplary digital microphone system that illustrates non-limiting aspects of an exemplary electrical circuit configured to process electrical signals associated with exemplary digital microphone systems as described herein.

FIG. 11 depicts an exemplary digital microphone system 1100 that illustrates non-limiting aspects of an exemplary electrical circuit configured to process electrical signals associated with exemplary digital microphone systems as described herein. For instance, as described above regarding FIGS. 1-2 and 5-6, etc., exemplary digital microphone system 1100 can comprise one or more exemplary MEMS acoustic or microphone sensors 102 (e.g., one or more of MEMS acoustic or microphone sensor 102a, 102b, . . . , 102n, etc.) operatively coupled to one or more components or circuitry 104 (e.g., one or more of components or circuitry 104a, 104b, . . . , 104n, etc.), or front end, one or more exemplary preamplifiers 106 (e.g., one or more of preamplifiers 106a, 106b, . . . , 106n, etc.) operatively coupled to the one or more output associated with the one or more components or circuitry 104 (e.g., one or more of components or circuitry 104a, 104b, . . . , 104n, etc.), one or more exemplary ADCs 108 (e.g., one or more of ADC 108a, 108b, . . . , 108n, etc.) operatively coupled to one or more outputs associated with the one or more preamplifiers 106, and/or an exemplary multipath digital audio combiner component 110 operatively coupled to one or more outputs associated with the one or more ADCs 108 (e.g., outputs associated with the one or more of ADC 108a, 108b, . . . , 108n, etc.).

Accordingly, FIG. 11 depicts one or more exemplary components or circuitry 104 (e.g., one or more of components or circuitry 104a, 104b, . . . , 104n, etc.), or front end, and amplifier configuration (e.g., configuration of the one or more exemplary preamplifiers 106) that can be employed in various non-limiting implementations of a digital two-path microphone system, for example, such as described above regarding FIGS. 1, 5-9, 11, etc. For instance, one or more exemplary components or circuitry 104 (e.g., one or more of components or circuitry 104a, 104b, . . . , 104n, etc.) can comprise charge pump 1102 that can provide a variable voltage to the one or more one or more exemplary MEMS acoustic or microphone sensors 102 (e.g., one or more of MEMS acoustic or microphone sensor 102a, 102b, . . . , 102n, etc.). Note that in FIG. 11, the amplifier configuration (e.g., configuration of the one or more exemplary preamplifiers 106) is shown in simplified form. It can be understood that in practice, feedback resistance would be placed in parallel to the $C_f$ and $C_{f2}$ capacitors in order to bias the input of the amplifiers (e.g., input of the one or more exemplary preamplifiers 106). In a further non-limiting aspect, amplifier (e.g., one or more exemplary preamplifiers 106) feedback resistance can be implemented in a variety of ways, including a resistor or switched capacitor network.

Figure 12:
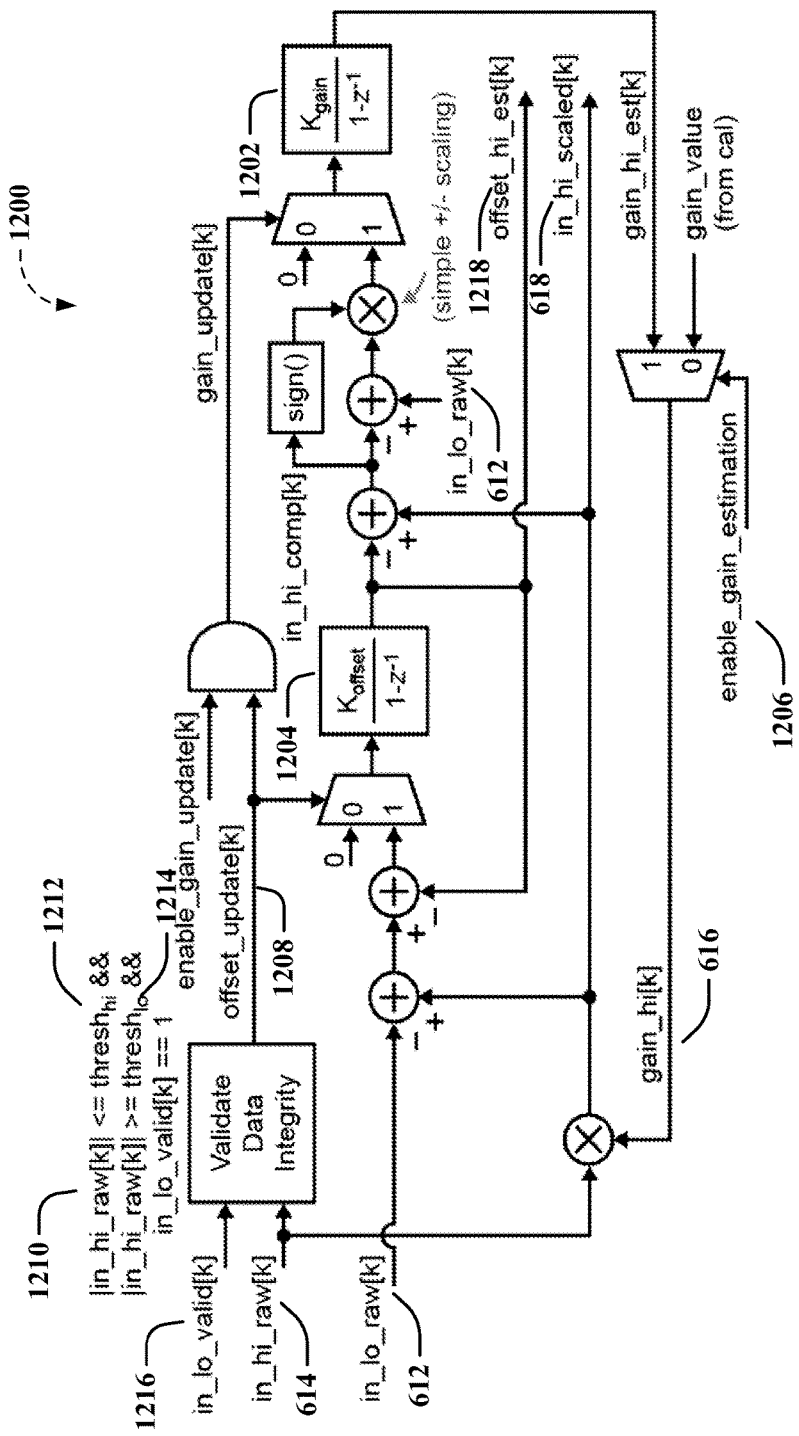
FIG. 12 depicts non-limiting aspects of an exemplary digital microphone system, comprising an exemplary multipath digital audio combiner component, directed to exemplary gain and offset estimation in a non-limiting implementation of two-path digital audio combiner component.

FIG. 12 depicts non-limiting aspects of an exemplary digital microphone system, comprising an exemplary multipath digital audio combiner component 110, directed to exemplary gain and offset estimation in a non-limiting implementation of two-path digital audio combiner component. As described above regarding FIG. 6, exemplary multipath digital audio combiner component 110 can comprise an exemplary gain and offset estimation component 204 that can be configured to estimate one or more of gain differences or offset differences between the one or more filtered digital audio signals. In a non-limiting aspect, exemplary multipath digital audio combiner component 110 can be configured to employ the one or more of gain differences or offset differences to scale one or more of the one or more of filtered digital audio signals to provide a scaled digital audio signal, and can be configured to adjust offset associated with the one or more of filtered digital audio signals. As a non-limiting example, exemplary gain and offset estimation component 204 can be configured to utilize information in in_lo_raw[k] (612) and in_hi_raw[k] (614) to estimate the gain and/or offset differences between each of these signals (e.g., in_lo_raw[k] (612) and in_hi_raw[k] (614)). In a further non-limiting aspect, a gain difference estimate can be employed to form a gain_hi[k] (616) signal to facilitate scaling the in_hi_raw[k] signal (614), with the resulting in_hi_scaled[k] (618) signal then having a matched scale factor to the in_lo_raw[k] (612) signal. Thus, FIG. 12 depicts non-limiting aspects of an exemplary digital implementation of exemplary gain and offset estimation component 204 utilized within an exemplary multipath digital audio combiner component 110 configured in a digital two-path microphone system. It can be understood that other methods for gain and offset estimation can also be employed. As a non-limiting example, exemplary gain and offset estimation component 204 can be configured to perform one or more of a least squares estimation, a correlation-based estimation, etc. of the one or more of gain differences or offset differences. In addition, exemplary gain and offset estimation component 204 can be further configured to estimate the one or more of gain differences or offset differences on a continuous basis to account for temperature variations, in further non-limiting implementations described herein. In another non-limiting aspect gain associated with the gain differences can be fixed (e.g., through a factory calibration, via a power up calibration sequence, etc.), whereby only offset is estimated in the background to account for temperature variations.

Referring to FIG. 6 and the estimation approach shown in FIG. 12, the value of $K_{gain}$ 1202 would generally be chosen to be significantly less than $K_{offset}$ 1204 in order to create a much lower bandwidth (e.g., longer convergence) for the gain estimation than for the offset estimation in order to avoid stability issues, in further non-limiting aspects. As a non-limiting example, slower convergence for the gain estimation should be acceptable for many applications since the gain between paths will often experience less variation than offset as temperature varies. Also, in some cases the gain will have low enough variation to not require continual calibration, in which case the gain estimation can be turned off by de-asserting the enable_gain_estimation 1206 signal shown in FIG. 12. In a non-limiting aspect, both offset and gain estimation, updates only occur when the signals from both Low SPL path (e.g., comprising exemplary preamplifier/buffer 602 and exemplary ADC 606) and High SPL path (e.g., comprising exemplary preamplifier/buffer 604 and exemplary ADC 608) are considered valid as controlled by the offset_update[k] (1208) signal. An example of the conditions under which offset_update[k] (1208) is asserted is depicted in FIG. 12. As a non-limiting example, therein, the absolute value of in_hi_raw[k] (1210) must be between thresholds $thresh_{lo}$ 1212 and $thresh_{hi}$ 1214 and the in_lo_valid (1216) signal, which can be controlled by the exemplary state machine diagrammed in FIG. 14, must be asserted. In other non-limiting aspects, other conditions may be used for control of assertion of offset_update[k] (1208), including applying criterion to the in_lo_raw[k] (612) signal.

Figure 13:
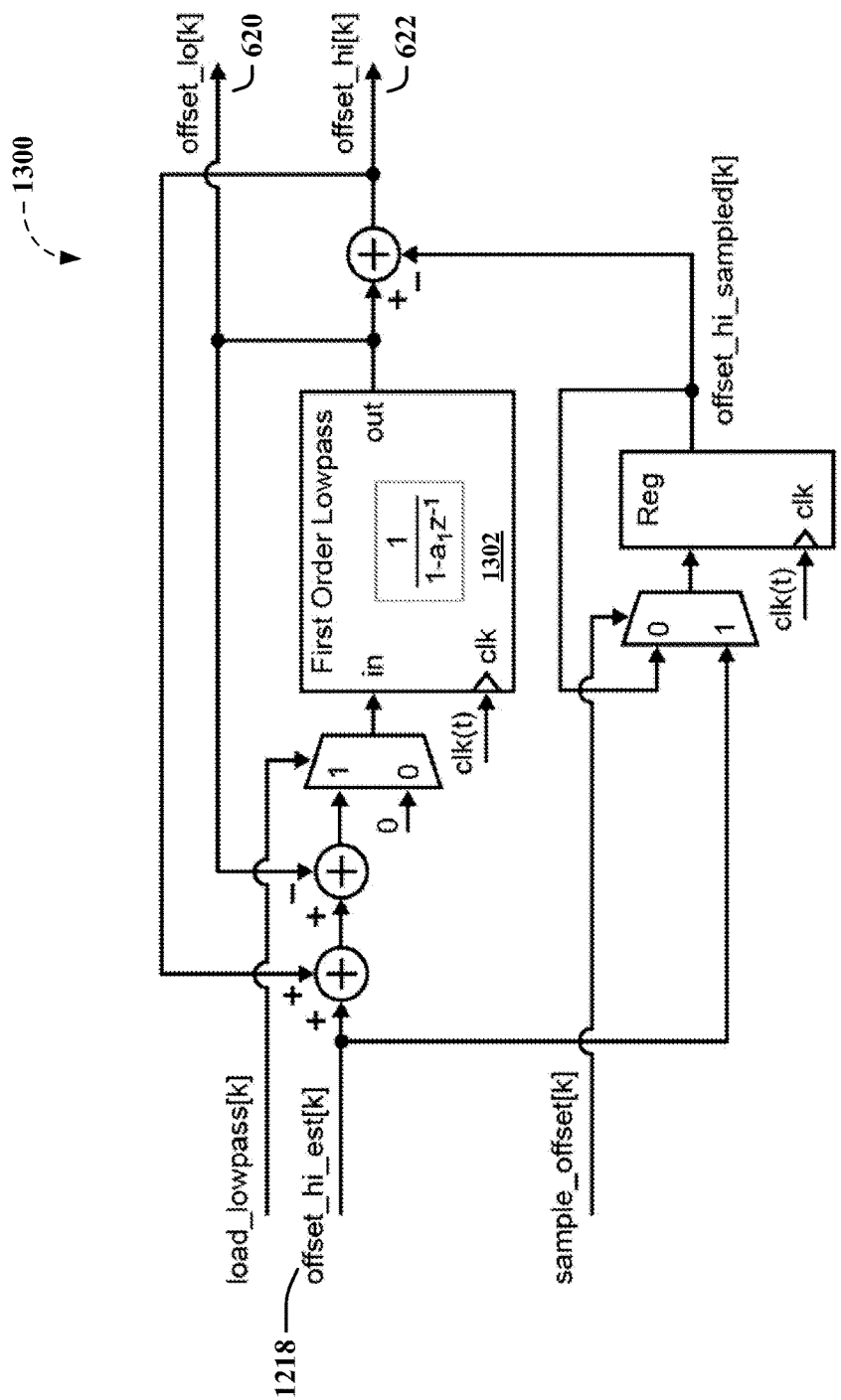
FIG. 13 depicts further non-limiting aspects of an exemplary digital microphone system, comprising an exemplary multipath digital audio combiner component, directed to exemplary calculation of offsets for low and high sound pressure level (SPL) signal paths in a non-limiting implementation of two-path digital audio combiner component.

FIG. 13 depicts further non-limiting aspects of an exemplary digital microphone system, comprising an exemplary multipath digital audio combiner component 110, directed to exemplary calculation of offsets for low and high SPL signal paths in a non-limiting implementation of two-path digital audio combiner component 110. For example, referring to FIGS. 6 and 13, offset_lo[k] (620) and offset_hi[k] (622) can be computed based on the offset_hi_est[k] (1218) signal calculated exemplary gain and offset estimation component 204 shown in FIG. 12. Regarding the exemplary implementation of FIG. 10, it is noted that the offset in the Low SPL path (e.g., comprising exemplary preamplifier/buffer 602 and exemplary ADC 606) may vary dynamically in the time following a transition from High SPL path (e.g., comprising exemplary preamplifier/buffer 604 and exemplary ADC 608) to Low SPL path (e.g., comprising exemplary preamplifier/buffer 602 and exemplary ADC 606) selection (e.g., transition of in_hi_selected[k] (628) from 1 to 0) due to settling behavior of the Low SPL path (e.g., comprising exemplary preamplifier/buffer 602 and exemplary ADC 606) amplifier after coming out of saturation when high audio signals occur. Accordingly, an exemplary lowpass filter 1302 shown in FIG. 13 can provide slow decay of offset_lo[k] (620) (and offset_hi[k] (622)) after transition of in_hi_selected[k] (628) from 1 to 0 to to prevent overly large wandering of the offset estimates due to this settling behavior. As a result, this slow decay time constant is set by the coefficient $a_1$ of exemplary lowpass filter 1302, which can be chosen such that the decay time is long enough to avoid having the impact of this settling behavior being audible. As a non-limiting example, assuming a clock frequency of 2.4 megahertz (MHz)/16=150 kilohertz (kHz), the value of $a_1$=1-$2^{12}$, achieving approximately 100 milliseconds (ms) decay time, which should be acceptably long to avoid audio artifacts in many applications. For example, exemplary simulated results of an exemplary digital microphone system 600 comprising an exemplary multipath digital audio combiner component 110 configured as a non-limiting implementation of two-path digital audio combiner component 110 are described below regarding FIG. 16, including behavior of offset_lo[k] (620) and offset_hi[k] (622).

Figure 14:
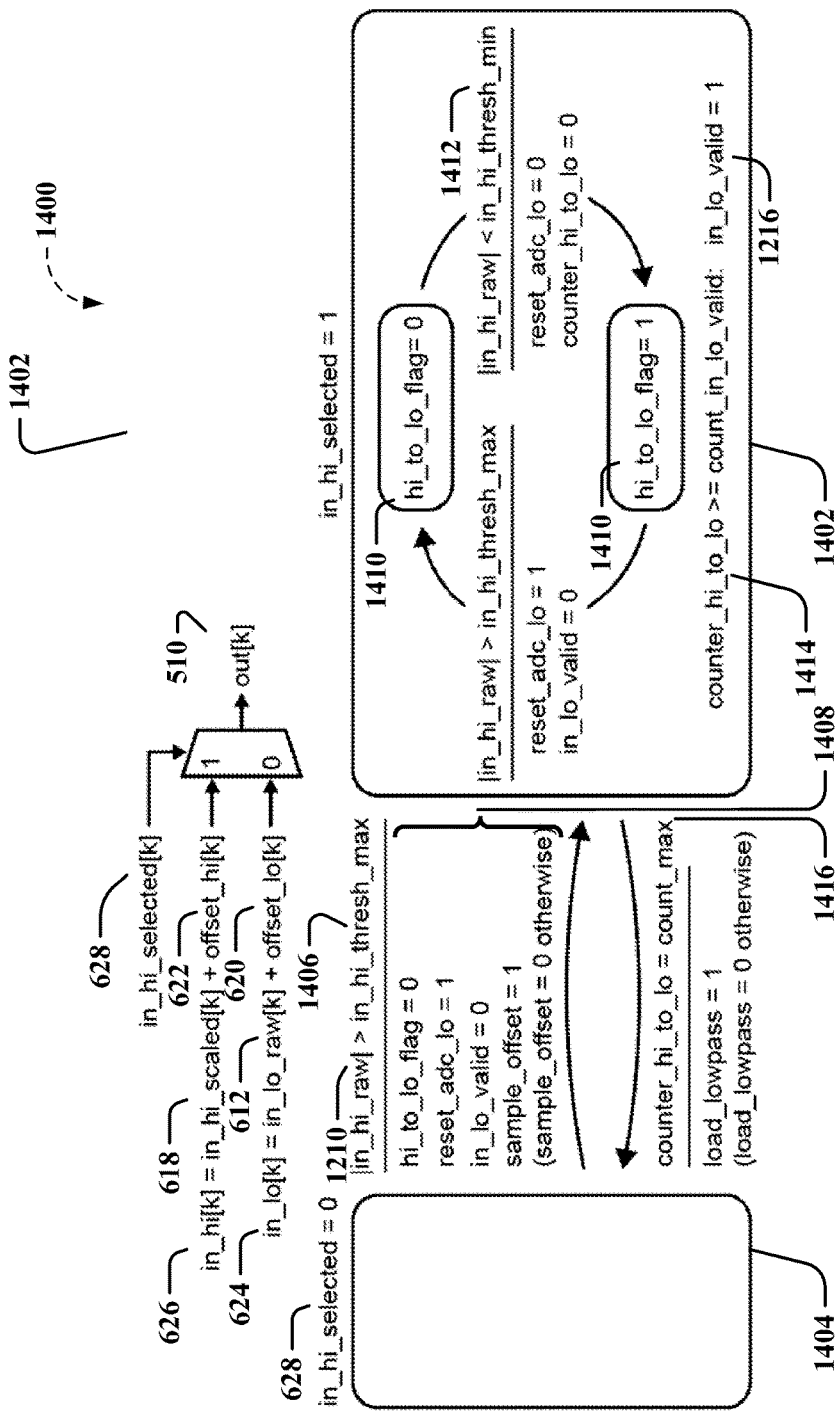
FIG. 14 depicts a non-limiting state diagram of an exemplary digital microphone system comprising an exemplary multipath digital audio combiner component configured as a non-limiting implementation of two-path digital audio combiner component.

FIG. 14 depicts a non-limiting state diagram 1400 of an exemplary digital microphone system (e.g., exemplary digital microphone system 600, etc.) comprising an exemplary multipath digital audio combiner component 110 configured as a non-limiting implementation of two-path digital audio combiner component. Note that the primary output of the exemplary state machine is the in_hi_selected[k] (628) signal which can control exemplary MUX component 112 switching/conveying either the Low SPL path (e.g., comprising exemplary preamplifier/buffer 602 and exemplary ADC 606) signal, 1402, or High SPL path (e.g., comprising exemplary preamplifier/buffer 604 and exemplary ADC 608) signal, at 1404, to the exemplary path combiner output, out[k] (510). In a non-limiting aspect, a change in selection from Low SPL path (e.g., comprising exemplary preamplifier/buffer 602 and exemplary ADC 606) to High SPL path (e.g., comprising exemplary preamplifier/buffer 604 and exemplary ADC 608), or a transition of in_hi_selected[k] (628) from 0 to 1, can occur immediately when the absolute value of in_hi_raw[k] (1210) exceeds a predetermined threshold, e.g., in_hi_thresh_max (1406). At this point, a number of signals 1408 are set as shown in FIG. 14.

In another non-limiting aspect contrasted with the immediate transition of in_hi_selected[k] (628) from 0 to 1 based on a threshold criterion (e.g., absolute value of in_hi_raw[k] (1210) exceeds a chosen threshold, in_hi_thresh_max (1406)), transition of in_hi_selected[k] (628) from 1 to 0 can be performed gradually, according to an algorithm, etc. As a non-limiting example, for transition from High SPL path (e.g., comprising exemplary preamplifier/buffer 604 and exemplary ADC 608) to Low SPL path (e.g., comprising exemplary preamplifier/buffer 602 and exemplary ADC 606), hi_to_lo_flag (1410) is initially set to 0 upon the transition of in_hi_selected[k] from 0 to 1, and goes high once the absolute value of in_hi_raw[k] 1210 falls below a predetermined threshold, e.g., in_hi_thresh_min (1412). Note that in_high_thresh_min (1412) will generally be set to be less than in_hi_thresh_max (1406). Once hi_to_low_flag (1410) is set to 1, counter_hi_to_lo (1414) can be set to 0 and can be incremented in following clock cycles. If counter_hi_to_lo (1414) reaches count_max (1416) in value, then in_hi_selected[k] (628) becomes 0 so that the Low SPL path (e.g., comprising exemplary preamplifier/buffer 602 and exemplary ADC 606) is the selected path. However, while the counter_hi_to_lo (1414) is below count_max (1416), if the absolute value of in_high_raw[k] (1210) exceeds a threshold in_hi_thresh_max (1406) then hi_to_lo_flag (1410) is set back to 0 as indicated in FIG. 14.

Accordingly, due to the extra delay or gradual transition imposed by the above algorithm when transitioning from the High SPL path (e.g., comprising exemplary preamplifier/buffer 604 and exemplary ADC 608) to Low SPL path (e.g., comprising exemplary preamplifier/buffer 602 and exemplary ADC 606), it can be understood that a higher noise floor will be present during that delay time at exemplary path combiner output, out[k] (510), after a large audio signal occurs even though the audio signal may have returned to small levels that can be handled by the Low SPL path Low SPL path (e.g., comprising exemplary preamplifier/buffer 602 and exemplary ADC 606). In addition, it should be further understood that the increased noise floor will not be of concern for applications focused on human listening due to temporal masking that occurs in human audio perception after loud sound events. However, for non-human focused applications (such as computer processing of speech, etc.), the change in noise floor level is non-ideal but is likely to be preferred compared to instantaneous saturation effects that can occur in AGC-based systems as described above.

Accordingly, disclosed embodiments described herein can provide exemplary multipath digital microphone systems (e.g., exemplary multipath digital microphone systems 600, 700, etc.) that can facilitate switching from conveying one digital audio signal to conveying another digital audio signal based on one or more switching criteria determined by an exemplary multipath digital audio combiner component. By employing gain and/or offset estimation, disclosed embodiments can facilitate switching from conveying one digital audio signal to conveying another digital audio signal without relying on zero crossing to change from high SPL paths to a low SPL path. In addition, by employing instantaneous switching from low SPL path to high SPL path various monuments as described herein can avoid saturation effects that would produce artifacts traditionally associated with conventional AGC systems. Moreover, various embodiments described herein can tolerate transient offset effects, for example in the transition from the from high SPL paths to low SPL path, as described above regarding FIG. 14

Figure 15:
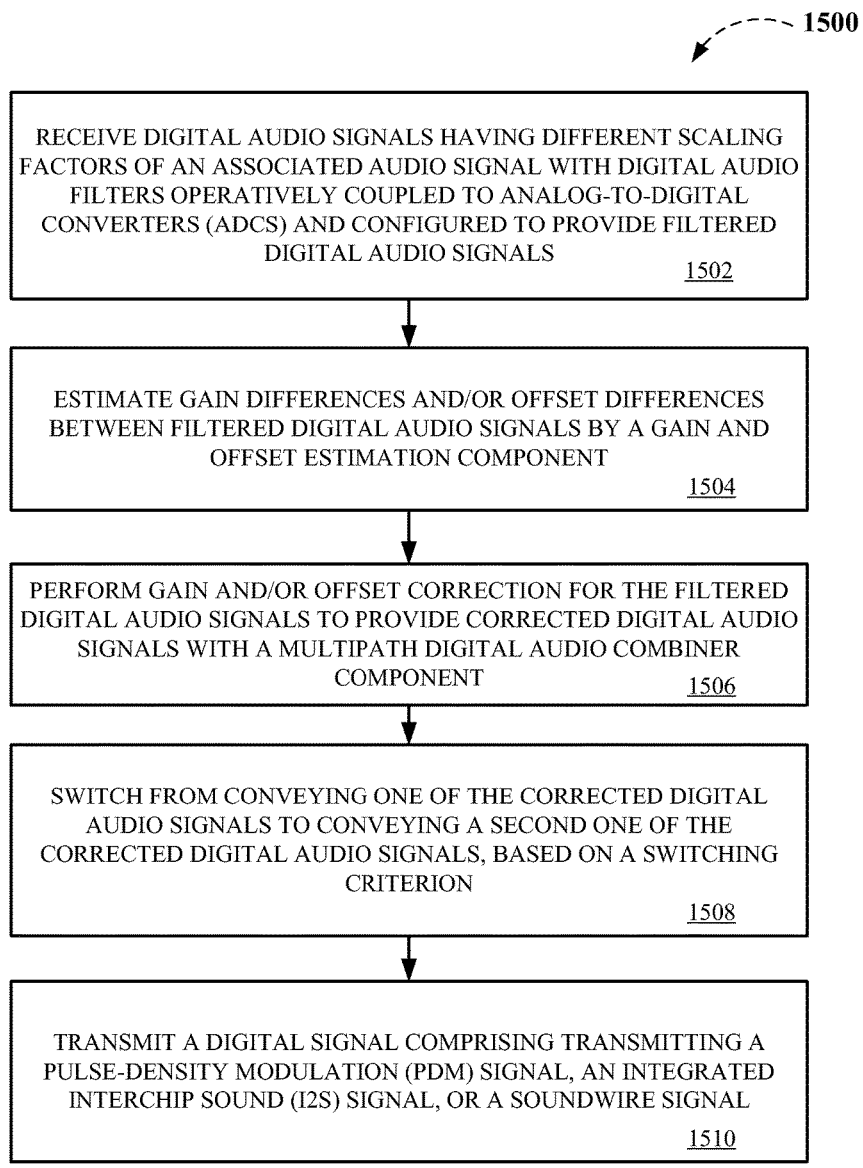
FIG. 15 depicts an exemplary flowchart of non-limiting methods associated with a various non-limiting embodiments of the subject disclosure.

In view of the subject matter described supra, methods that can be implemented in accordance with the subject disclosure will be better appreciated with reference to the flowcharts of FIG. 15. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 15 depicts an exemplary flowchart of non-limiting methods 1500 associated with a various non-limiting embodiments of the subject disclosure. For instance, exemplary methods 1500 can comprise, at 1502, receiving one or more digital audio signals having different scaling factors of an associated audio signal with one or more of digital audio filters 202 (e.g., one or more of digital audio filters 202a, 202b, . . . , 202n, decimators 610, low pass filters 702, etc.) operatively coupled to one or more exemplary ADCs 108 (e.g., one or more of ADC 108a, 108b, . . . , 108n, 606, 608, etc.) and configured to provide one or more filtered digital audio signals. As a non-limiting example, exemplary methods 1500, at 1502, can comprise receiving the one or more digital audio signals with one or more of one or more decimators 610 or one or more low pass filters 702, for example, as further described herein.

In addition, exemplary methods 1500 can comprise, at 1504, estimating one or more of gain differences and/or offset differences between the one or more filtered digital audio signals by an exemplary gain and offset estimation component 204. In a further non-limiting example, exemplary methods 1500 can comprise estimating the one or more of gain differences or offset differences on a continuous basis to account for temperature variations. In yet another non-limiting example of exemplary methods 1500, estimating one or more of gain differences or offset differences by exemplary gain and offset estimation component 204, at 1504, can comprise performing one or more of a least squares estimation or a correlation-based estimation of the one or more of gain differences or offset differences, for example, as further described above.

Exemplary methods 1500 can further comprise, at 1506, performing one or more of gain and/or offset correction for the one or more filtered digital audio signals to provide one or more corrected digital audio signals with a multipath digital audio combiner component 110. As a non-limiting example, at 1506, exemplary methods 1500 can also comprise scaling one or more of the filtered digital audio signals to provide a scaled digital audio signal and adjusting offset associated with the one or more filtered digital audio signals based on the one or more of gain differences or offset differences.

In addition, exemplary methods 1500 can comprise, at 1508, switching from conveying one of the one or more corrected digital audio signals to conveying a second one of the one or more corrected digital audio signals, based on one or more switching criteria, including, but not limited to switching based on one or more of amplitude measurement, absolute value of the amplitude measurement, or root-mean-square power measurement of digitized data associated with the one or more filtered digital audio signals. As a non-limiting example of exemplary methods 1500, switching based on the one or more switching criteria, at 1508, can comprise switching abruptly (e.g., a transition of in_hi_selected[k] (628) from 0 to 1), based on a predefined switching algorithm, etc. for example, as further described above regarding FIG. 14. In a further non-limiting example of exemplary methods 1500, switching based on the one or more switching criteria, at 1508, can comprise switching based on the one or more filtered digital audio signals having a characteristic measurement above a threshold as further described above regarding FIG. 14, for example.

Exemplary methods 1500 can further comprise, at 1510, transmitting a digital signal based on the one or more digital audio signals having different scaling factors of the associated audio signal. As a non-limiting example, exemplary methods 1500 can further comprise, at 1510, transmitting one or more of a PDM signal, $I^2S$ signal, or a Soundwire signal, for example, as further described above, regarding FIGS. 8-10.

However, various exemplary implementations of exemplary methods 1500 as described can additionally, or alternatively, include other process steps associated with features or functionality of exemplary digital microphone systems, and so on, as further detailed herein, for example, regarding FIGS. 1-14.

Figure 16:
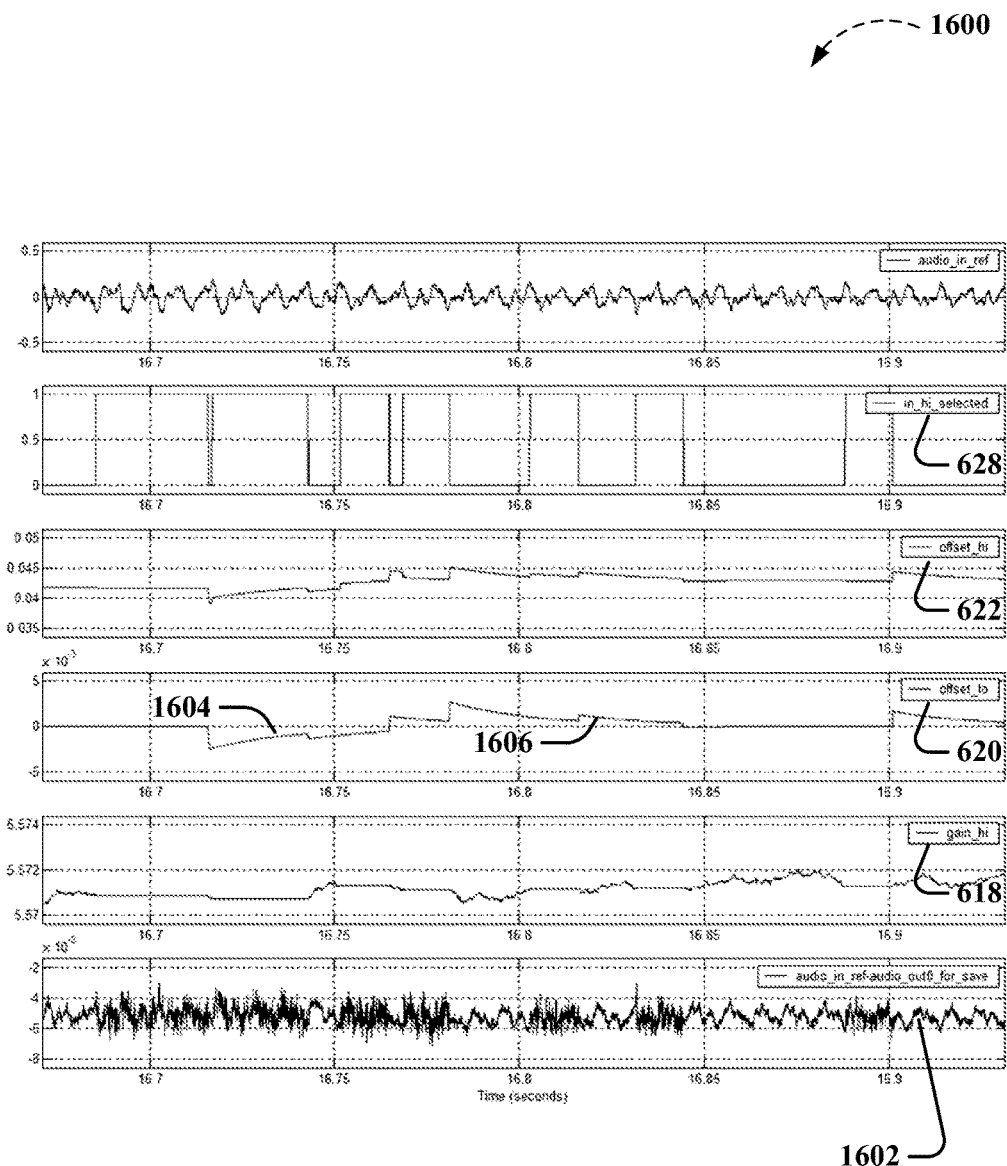
FIG. 16 demonstrates exemplary simulated results of an exemplary digital microphone system comprising an exemplary multipath digital audio combiner component configured as a non-limiting implementation of two-path digital audio combiner component.

FIG. 16 demonstrates exemplary simulated results of an exemplary digital microphone system (e.g., exemplary digital microphone system 600, etc.) comprising an exemplary multipath digital audio combiner component 110 configured as a non-limiting implementation of two-path digital audio combiner component. These exemplary results reveal that the error signal 1602 does not exhibit discontinuous jumps as in_hi_selected[k] (628) alternates between selecting (e.g., in_hi_selected[k] (628)=0) the Low SPL path (e.g., comprising exemplary preamplifier/buffer 602 and exemplary ADC 606) and selecting (e.g., in_hi_selected[k] (628)=1) High SPL path (e.g., comprising exemplary preamplifier/buffer 604 and exemplary ADC 608). Also, the offset_lo[k] (620) and offset_hi[k] (622) signals are shown to decay in a manner that allows offset_lo[k] (620) to tend toward a long term value of zero (1604, 1606, etc.), for example, as further described above regarding FIG. 14.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

As used in this application, the terms "component," "module," "device" and "system" are intended to refer to a computer-related entity, either hardware, a combination of hardware and software, software, or software in execution. As one example, a component or module can be, but is not limited to being, a process running on a processor, a processor or portion thereof, a hard disk drive, multiple storage drives (of optical and/or magnetic storage medium), an object, an executable, a thread of execution, a program, and/or a computer. By way of illustration, both an application running on a server and the server can be a component or module. One or more components or modules scan reside within a process and/or thread of execution, and a component or module can be localized on one computer or processor and/or distributed between two or more computers or processors.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. An apparatus, comprising:
 a multipath digital audio combiner component comprising:
 a plurality of digital audio filters operatively coupled to a plurality of analog-to-digital converters (ADCs) and configured to receive a plurality of digital audio signals having different scaling factors of an associated audio signal and configured to provide a plurality of filtered digital audio signals;
 a gain and offset estimation component configured to estimate gain differences and offset differences between the plurality of filtered digital audio signals, wherein the gain and offset estimation component is further configured to estimate the offset differences on a continuous basis; and
 a multiplexing component configured to switch from conveying one of a plurality of corrected digital audio signals to conveying a second one of the plurality of corrected digital audio signals, wherein the multipath digital audio combiner component is further configured to perform gain and offset correction for the plurality of filtered digital audio signals to provide the plurality of corrected digital audio signals.

2. The apparatus of claim 1, wherein the multipath digital audio combiner component is further configured to employ the gain differences to scale at least one of the plurality of filtered digital audio signals to provide a scaled digital audio signal and configured to employ the offset differences to adjust offset associated with the plurality of filtered digital audio signals from the gain and offset estimation component.

3. The apparatus of claim 1, wherein the multipath digital audio combiner component is further configured to control the multiplexing component to switch from conveying the one of the plurality of corrected digital audio signals to conveying the second one of the plurality of corrected digital audio signals based on the at least one of the plurality of filtered digital audio signals having a characteristic measurement above a threshold.

4. The apparatus of claim 1, wherein the multipath digital audio combiner component is further configured to control the multiplexing component to switch from conveying the one of the plurality of corrected digital audio signals to conveying the second one of the plurality of corrected digital audio signals based on at least one of amplitude measurement, absolute value of the amplitude measurement, or root-mean-square power measurement of digitized data associated with the plurality of filtered digital audio signals.

5. The apparatus of claim 1, wherein the multipath digital audio combiner component is further configured to control the multiplexing component to switch from conveying the one of the plurality of corrected digital audio signals to conveying the second one of the plurality of corrected digital audio signals at least one of abruptly, gradually, or based on a predefined algorithm.

6. The apparatus of claim 1, wherein the gain and offset estimation component is further configured to perform at least one of a least squares estimation or a correlation-based estimation of the gain differences or the offset differences.

7. The apparatus of claim 1, wherein the multipath digital audio combiner component is further configured to adjust the at least one of the plurality of filtered digital audio signals to provide the plurality of corrected digital audio signals based on the gain differences and offset differences from the gain and offset estimation component.

8. The apparatus of claim 1, wherein the plurality of digital audio filters comprise at least one of a plurality of decimators or a plurality of low pass filters.

9. The apparatus of claim 1, further comprising:
an output component configured to transmit a digital signal based on the plurality of digital audio signals having different scaling factors of the associated audio signal comprising at least one of a pulse-density modulation (PDM) signal, an integrated interchip sound (I2S) signal, or a Soundwire signal.

10. The apparatus of claim 9, wherein the output component comprises at least one of a signal upsampler component or signal reshaper component configured to provide the PDM signal, or a decimation filter configured to provide the I2S signal.

11. A method, comprising:
receiving a plurality of digital audio signals having different scaling factors of an associated audio signal with a plurality of digital audio filters operatively coupled to a plurality of analog-to-digital converters (ADCs) and configured to provide a plurality of filtered digital audio signals;
estimating gain differences and offset differences between the plurality of filtered digital audio signals by a gain and offset estimation component;
performing a gain and an offset correction for the plurality of filtered digital audio signals to provide a plurality of corrected digital audio signals with a multipath digital audio combiner component and based on the gain differences and offset differences from the gain and offset estimation component; and
switching from conveying one of a plurality of corrected digital audio signals to conveying a second one of the plurality of corrected digital audio signals, based on at least one switching criteria.

12. The method of claim 11, wherein the switching based on the at least one switching criteria comprises switching based on at least one of amplitude measurement, absolute value of the amplitude measurement, or root-mean-square power measurement of digitized data associated with the plurality of filtered digital audio signals.

13. The method of claim 11, wherein the switching based on the at least one switching criteria comprises switching abruptly, gradually, or based on a predefined switching algorithm.

14. The method of claim 11, wherein the estimating the gain differences and the offset differences by the gain and offset estimation component comprises performing at least one of a least squares estimation or a correlation-based estimation of the gain differences or the offset differences.

15. The method of claim 11, wherein the receiving the plurality of digital audio signals with the plurality of digital audio filters comprises receiving the plurality of digital audio signals with at least one of a plurality of decimators or a plurality of low pass filters.

16. The method of claim 11, further comprising:
estimating at least one of the gain differences or the offset differences on a continuous basis to account for temperature variations.

17. The method of claim 11, further comprising:
scaling at least one of the plurality of filtered digital audio signals to provide a scaled digital audio signal and adjusting offset associated with the plurality of filtered digital audio signals based on the gain differences and the offset differences.

18. The method of claim 11, further comprising:
transmitting a digital signal based on the plurality of digital audio signals having different scaling factors of the associated audio signal comprising transmitting at least one of a pulse-density modulation (PDM) signal, an integrated interchip sound (I2S) signal, or a Soundwire signal.

19. The method of claim 11, wherein the switching based on the at least one switching criteria comprises switching based on the at least one of the plurality of filtered digital audio signals having a characteristic measurement above a threshold.

20. A system comprising:
at least one microelectromechanical systems (MEMS) acoustic sensor configured to receive at least one acoustic signal;
a first circuit having at least one input coupled to the at least one MEMS acoustic sensor to receive, via the input, at least one electrical signal that varies in accordance with the at least one acoustic signal, the first circuit having at least one output and being configured to process the at least one electrical signal and configured to provide at least one corresponding processed electrical signal at the at least one output;
a plurality of preamplifiers operatively coupled to the at least one output, wherein the plurality of preamplifiers are configured to receive the at least one corresponding processed electrical signal, and wherein the plurality of preamplifiers are configured to apply a plurality of first scaling factors to the at least one corresponding processed electrical signal;
a plurality of analog-to-digital converters (ADCs) operatively coupled to a plurality of outputs associated with the plurality of preamplifiers and are configured to provide a plurality of digital audio signals having different scaling factors associated with the at least one acoustic signal;
a multipath digital audio combiner component operatively coupled to a plurality of outputs associated with the plurality of ADCs and configured to perform gain and offset correction for the plurality of digital audio signals, based on gain and offset estimation by a gain and offset estimation component configured to estimate the offset differences on a continuous basis, to provide a plurality of corrected digital audio signals according to a plurality of second scaling factors; and
a multiplexing component associated with the multipath digital audio combiner component configured to switch from conveying one of a plurality of corrected digital audio signals to conveying a second one of the plurality of corrected digital audio signals, based on at least one switching criteria determined by the multipath digital audio combiner component.

21. The system of claim 20, wherein the at least one microelectromechanical systems (MEMS) acoustic sensor comprises a plurality of MEMS acoustic sensors, wherein the plurality of MEMS acoustic sensors are at least one of configured to receive at least one of the acoustic signal or a variation associated with the acoustic signal or are comprised of disparate transducer structures.

22. The system of claim 20, wherein the first circuit comprises at least one adjustable direct current (DC) bias voltage circuit operatively coupled to the at least one MEMS acoustic sensor and configured to adjust at least one DC bias voltage provided to the at least one MEMS acoustic sensor.

23. The system of claim 20, wherein the at least one switching criteria comprises at least one of amplitude measurement, absolute value of the amplitude measurement, root-mean-square power measurement of digitized data associated with the plurality of digital audio signals, or at least one of the plurality of digital audio signals having a characteristic measurement above a threshold.

24. The system of claim 23, wherein at least one of the threshold or at least one of the plurality of second scaling factors are adjustable based on a desired performance parameter associated with the system.

25. The system of claim 24, further comprising:
circuitry integrated within the system for configuring at least one of the plurality of first scaling factors associated with at least one of the plurality of preamplifiers.

* * * * *